(12) United States Patent
Shin et al.

(10) Patent No.: US 10,791,254 B2
(45) Date of Patent: Sep. 29, 2020

(54) LENS ASSEMBLY FOR SURVEILLANCE CAMERA AND SURVEILLANCE CAMERA INCLUDING THE SAME

(71) Applicant: HANWHA TECHWIN CO., LTD., Seongnam-si (KR)

(72) Inventors: Hyun Soo Shin, Seongnam-si (KR); Han Sol Yoon, Seongnam-si (KR)

(73) Assignee: HANWHA TECHWIN CO., LTD., Seongnam-si (KR)

( * ) Notice: Subject to any disclaimer, the term of this patent is extended or adjusted under 35 U.S.C. 154(b) by 0 days.

(21) Appl. No.: 16/153,836

(22) Filed: Oct. 8, 2018

(65) Prior Publication Data
US 2019/0327398 A1    Oct. 24, 2019

(30) Foreign Application Priority Data

Apr. 24, 2018    (KR) .................. 10-2018-0047322

(51) Int. Cl.
| | |
|---|---|
| *H04N 5/225* | (2006.01) |
| *H05K 1/18* | (2006.01) |
| *G08B 13/196* | (2006.01) |
| *G03B 19/02* | (2006.01) |
| *G03B 17/08* | (2006.01) |
| *G03B 37/04* | (2006.01) |
| *H04N 5/247* | (2006.01) |

(52) U.S. Cl.
CPC ........... *H04N 5/2254* (2013.01); *G03B 17/08* (2013.01); *G03B 37/04* (2013.01); *H04N 5/2252* (2013.01); *H04N 5/2258* (2013.01); *H04N 5/247* (2013.01); *H05K 1/189* (2013.01); *H05K 2201/10121* (2013.01)

(58) Field of Classification Search
None
See application file for complete search history.

(56) References Cited

U.S. PATENT DOCUMENTS

| | | |
|---|---|---|
| 9,438,782 B2 | 9/2016 | Donaldson |
| 9,860,970 B2 | 1/2018 | Tolbert et al. |
| | (Continued) | |

FOREIGN PATENT DOCUMENTS

| | | |
|---|---|---|
| GB | 2461795 | 1/2010 |
| KR | 10-1448995 | 10/2014 |
| | (Continued) | |

OTHER PUBLICATIONS

Partial European Search Report dated Jul. 29, 2019, in European Patent Application No. 18212329.9.

(Continued)

*Primary Examiner* — Mark T Monk
(74) *Attorney, Agent, or Firm* — H.C. Park & Associates, PLC

(57) ABSTRACT

A lens assembly for a surveillance camera and the surveillance camera are provided. The lens assembly includes: a lens case; a lens body in which the lens case is received; a sensor circuit board having a sensor connected with the lens body, and being disposed in the lens case; and a flexible circuit board disposed inside the lens body facing the lens case, and being connected to the sensor circuit board, and bent at least once such that at least one portion of the flexible circuit board overlaps another portion thereof.

19 Claims, 16 Drawing Sheets

(56) References Cited

U.S. PATENT DOCUMENTS

| | | |
|---|---|---|
| 2003/0016300 A1 | 1/2003 | Ting |
| 2004/0160512 A1* | 8/2004 | Lee ........................ H04N 5/232 |
| | | 348/42 |
| 2009/0091632 A1 | 4/2009 | Okamoto et al. |
| 2012/0242785 A1 | 9/2012 | Sasagawa et al. |
| 2012/0242788 A1 | 9/2012 | Chuang et al. |
| 2015/0264232 A1 | 9/2015 | Yang |
| 2017/0091923 A1* | 3/2017 | Siercks .................. G01C 11/02 |
| 2017/0299949 A1 | 10/2017 | Donaldson |

FOREIGN PATENT DOCUMENTS

| | | |
|---|---|---|
| WO | 2004095386 | 11/2004 |
| WO | 2006075381 | 7/2006 |

OTHER PUBLICATIONS

Extended European Search Report dated Nov. 19, 2019, in European Patent Application No. 18212329.9.

* cited by examiner

LENS ASSEMBLY FOR SURVEILLANCE CAMERA AND SURVEILLANCE CAMERA INCLUDING THE SAME

CROSS-REFERENCE TO RELATED APPLICATION

This application claims priority from and the benefit of Korean Patent Application No. 10-2018-0047322, filed on Apr. 24, 2018, which is hereby incorporated by reference for all purposes as if fully set forth herein.

BACKGROUND

Field

Exemplary embodiments of the invention relate generally to an apparatus, and more particularly, to a lens assembly for a surveillance camera and a surveillance camera including the same.

Discussion of the Background

A general surveillance camera may capture an event occurring outside by using a camera. Recently, to obtain images of an event occurring in various directions, a surveillance camera may have a plurality of lens assemblies.

Various structures may be used to arrange the plurality of lens assemblies in various angles. A plurality of general lens assemblies may be fixed at a specific location of a housing by using screws, bolts, etc. In this case, when at least one of the plurality of lens assemblies is removed, locations of the rest of the lens assemblies cannot be changed and the surveillance camera may generate a wide blind spot.

Also, in the case where a plurality of lens assemblies are used, the plurality of lens assemblies may be fixed at various locations. To arrange each of the fixed lens assemblies at another location of the housing, the housing itself should be replaced. Furthermore, lens assemblies arranged at different locations may not be exchanged.

The plurality of lens assemblies may have different resolutions. In this case, the lens assemblies have sizes that are different from each other. Since shapes of the lens assemblies are manufactured differently, to arrange the lens assemblies on the housing, separate brackets or cases, etc. corresponding to the lens assemblies of respective resolutions should be manufactured.

One known surveillance camera design is disclosed in U.S. Patent Publication No. 2017-0299949 (title: OMNIDIRECTIONAL USER CONFIGURABLE MULTI-CAMERA HOUSING, applicant: ARECONT VISION, LLC).

The above information disclosed in this Background section is only for understanding of the background of the inventive concepts, and, therefore, it may contain information that does not constitute prior art.

SUMMARY

A lens assembly for a surveillance camera and a surveillance camera including the same constructed according to the principles and exemplary implementations of the invention enable lens assemblies having different resolutions to be mounted in housings of substantially the same size and to be quickly and conveniently mounted to and removed from the surveillance camera.

Additional features of the inventive concepts will be set forth in the description which follows, and in part will be apparent from the description, or may be learned by practice of the inventive concepts.

According to one or more exemplary embodiments, a lens assembly includes: a lens case; a lens body in which the lens case is received; ; a sensor circuit board having a sensor connected with the lens body and disposed in the lens case; and a flexible circuit board arranged inside the lens body, facing the lens case, connected to the sensor circuit board, and bent at least once.

The lens body may include a lens unit and the lens case may include at least one lens.

The lens assembly may further include a substrate connector arranged on the sensor circuit board.

The substrate connector and an external contact connector of the flexible circuit board may be stacked on each other.

The lens assembly may further include: a bottom housing arranged outside the lens case and receiving the lens case; and an top housing coupled to the bottom housing.

The bottom housing may include a housing connector connected with the substrate connector of the lens case.

The lens assembly further include: a housing circuit board arranged inside the bottom housing and electrically connected to the substrate connector of the lens case.

The lens assembly further include: an elastic supporter arranged between the bottom housing and the housing circuit board and configured to provide elastic force to the housing circuit board.

A fixing member receiving hole may be formed in the bottom housing, the fixing member receiving hole receiving a fixing member configured to fix a location of the lens case.

One of the bottom housing and the lens case may include a focus determining protrusion protruding from one of the bottom housing and the lens case toward the other of the bottom housing and the lens case, and the other of the bottom housing and the lens case may include a receiving portion in which the focus determining protrusion is received.

According to another exemplary embodiments, a surveillance camera includes: one or more lens brackets spaced apart from each other; a central shaft spaced apart from the lens brackets; a first lens assembly having a first size and a first resolution, and being coupled to the lens bracket or the central shaft; and a second lens assembly having a second size and a second resolution, and being coupled to the lens bracket or the central shaft, wherein the first resolution is different from the second resolution of the second lens assembly, and the first size is substantially the same as the second size.

The surveillance camera may further include a support member, the lens bracket being movably supported by and detachably coupled to the support member.

The support member may include a rail.

The rail may be generally annular in shape.

At least one of the first lens assembly and the second lens assembly may include: a lens case; a lens body in which the lens case is received; a sensor circuit board; a sensor connected with the lens unit and disposed on the sensor circuit board and inside the lens body; and a flexible circuit board arranged inside the lens body, connected to the sensor circuit board, and bent at least one time.

The surveillance camera may further include: a substrate connector arranged on the sensor circuit board.

The substrate connector and an external contact connector of the flexible circuit board may be stacked each other.

The surveillance camera may further include: a bottom housing arranged outside the lens case and receiving the lens case; and an top housing coupled to the first lens housing.

The bottom housing may include a housing connector connected with a substrate connector of the lens case.

The surveillance camera may further include: a housing circuit board arranged inside the bottom housing and electrically connected with a substrate connector of the lens case.

The surveillance camera may further include: an elastic supporter arranged between the bottom housing and the housing circuit board and configured to provide elastic force to the housing circuit board.

A fixing member receiving hole may be formed in the bottom housing, the fixing member receiving hole receiving a fixing member configured to fix the lens case.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
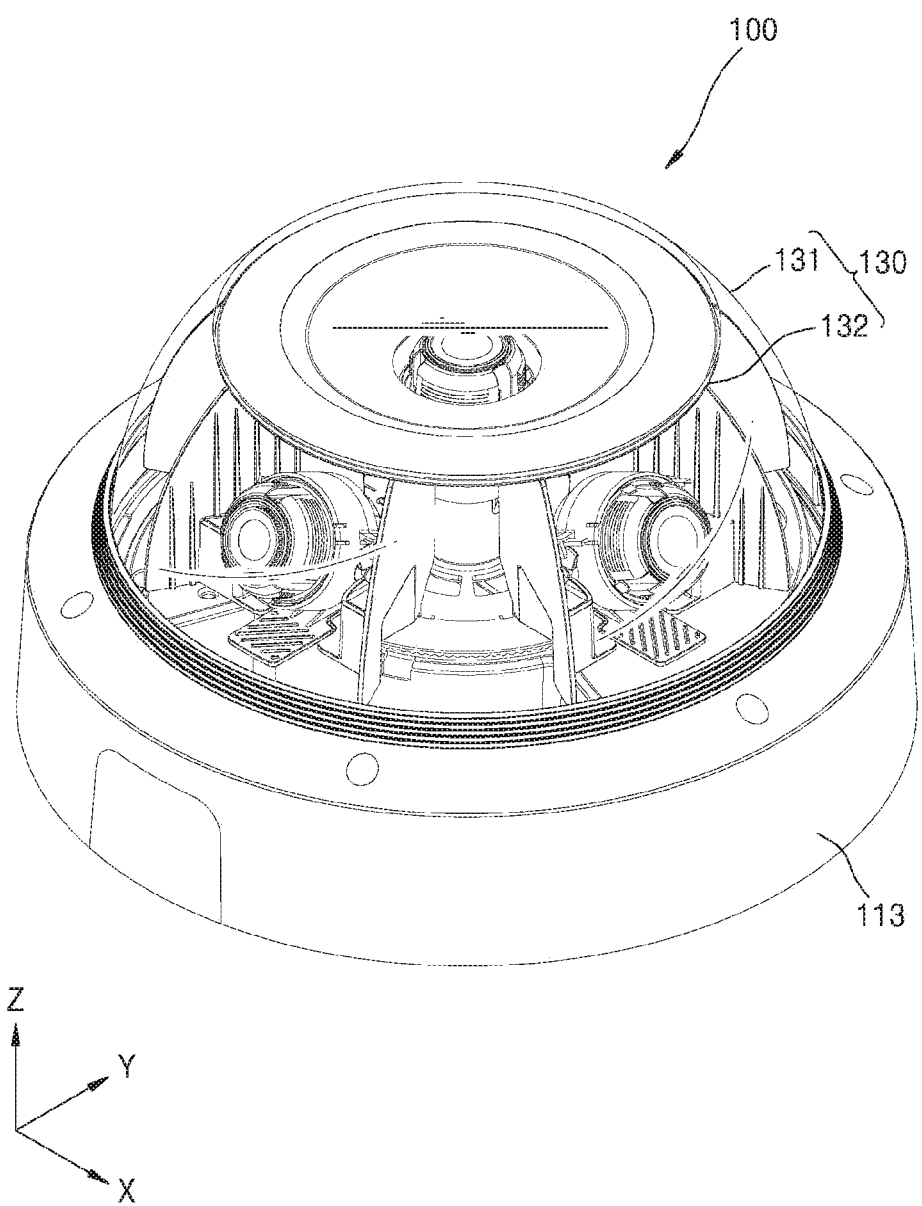
FIG. 1 is a perspective view of a surveillance camera constructed according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular exemplary embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
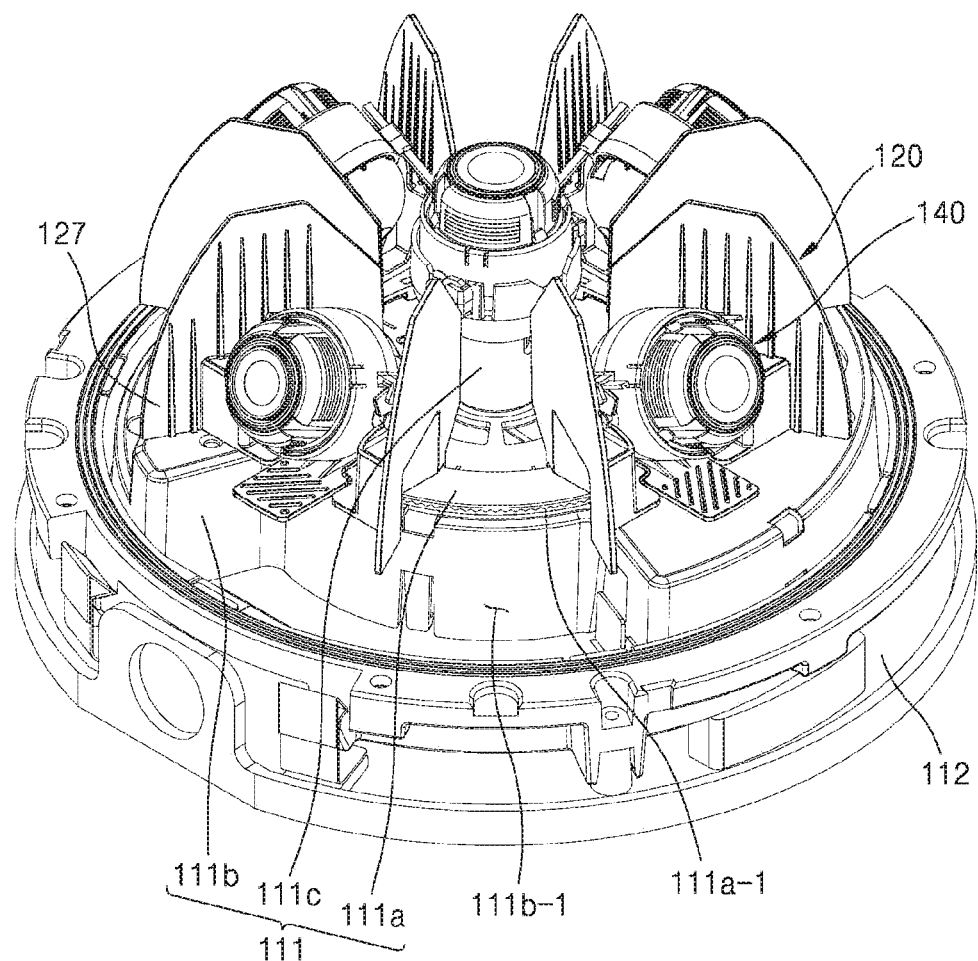
FIG. 2 is a perspective view of a portion of the surveillance camera of FIG. 1.

FIG. 1 is a perspective view of a surveillance camera 100 constructed according to an exemplary embodiment of the invention, and FIG. 2 is a perspective view of a portion of the surveillance camera 100 of FIG. 1.

Referring to FIGS. 1 and 2, the surveillance camera 100 includes a base housing 111, a fixed housing 112, a cover housing 113, a lens bracket 120, a cover 130, and a lens assembly 140.

The lens bracket 120 may be arranged in or mounted to the base housing 111. Also, the base housing 111 may be fixed to the fixed housing 112. In this case, the base housing 111 may include a rail 111a on which the lens bracket 120 is arranged, a base housing body portion 111b on which the rail 111a is arranged, and a central shaft 111c arranged at a center of the base housing body portion 111b.

Figure 3:
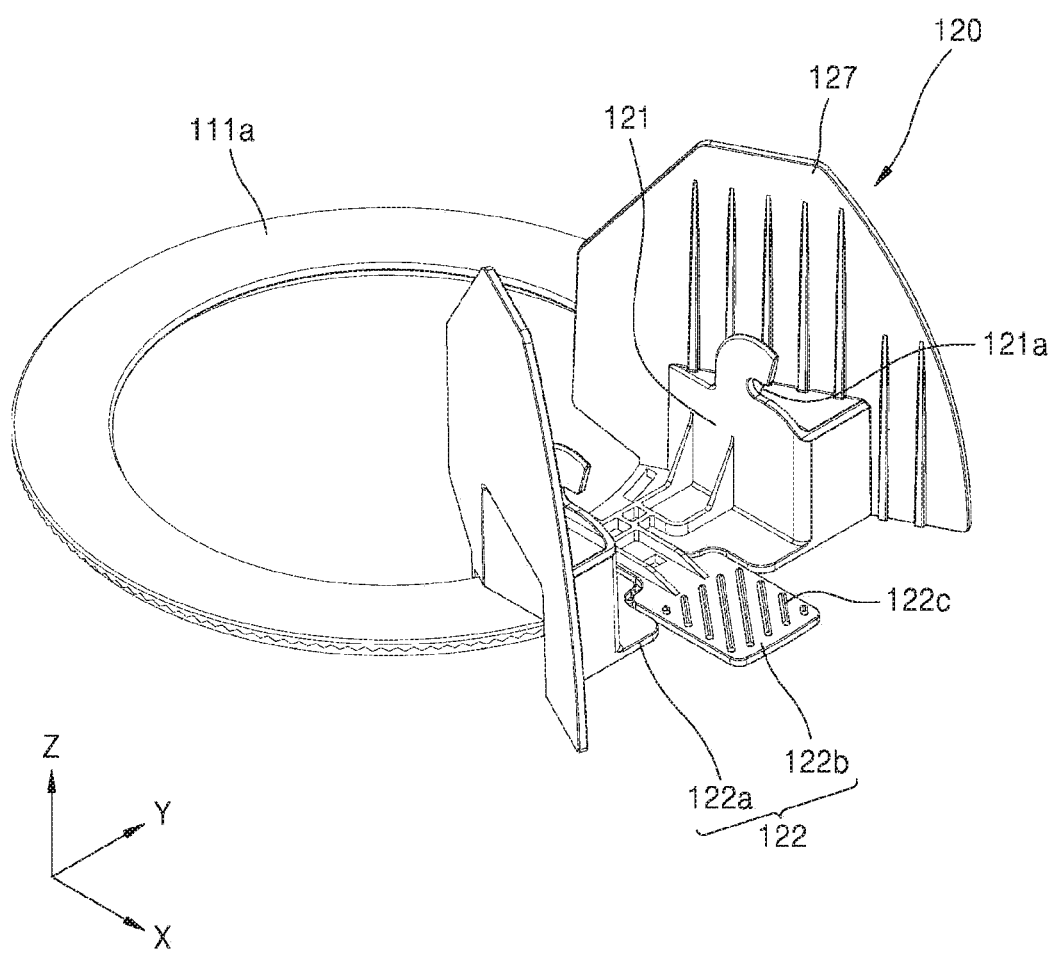
FIG. 3 is a perspective view of a lens bracket and a rail shown in FIG. 2.

The rail 111a may be provided in an annular shape, as shown best in FIG. 3. Also, a back surface of the rail 111a may be curved. For example, the rail 111a may include a rail protrusion 111a-1 protruding on the back surface thereof. In this case, the rail protrusion 111a-1 may be provided as a plurality of rail protrusions. The plurality of rail protrusions 111a-1 may be arranged along the back surface of the rail 111a to circumnavigate around the outer periphery of the rail 111a. Each rail protrusion 111a-1 may be arranged on the back surface of the rail 111a such that a lengthwise direction of each rail protrusion 111a-1 faces a center of the rail 111a.

The base housing body portion 111b may be arranged on the back surface of the rail 111a. In this case, the rail 111a may be spaced apart from a front surface of the base housing body portion 111b. The base housing body portion 111b may include a first recess 111b-1 configured to attach or detach the lens bracket 120 when coupling the lens bracket 120 on the rail 111a or separating the lens bracket 120 from the rail 111a. The first recess 111b-1 may be recessed from an outer surface of the base housing body portion 111b to a central portion of the base housing body portion 111b.

The central shaft 111c (FIG. 12) may be arranged on a center of the rail 111a, and one of the lens assemblies 140 may be arranged on the central shaft 111c. In this case, the central shaft 111c may be coupled to the lens assembly 140 in various manners such as one in which the lens assembly 140 is inserted and one in which the lens assembly 140 is fixed. Also, the central shaft 111c may be formed as one body with the base housing body portion 111b, or may be formed separately from the base housing body portion 111b and coupled to the base housing body portion 111b. In the case where the base housing body portion 111b and the central shaft 111c are separately coupled, the base housing body portion 111b may be coupled to the central shaft 111c by using various methods. In an exemplary embodiment, the base housing body portion 111b may be connected to the central shaft 111c by using various members such as a screw and a bolt. In another exemplary embodiment, a protrusion such as a hook may be formed on one of the base housing body portion 111b and the central shaft 111c, and a recess receiving the protrusion may be formed in the other of the base housing body portion 111b and the central shaft 111c, so that the protrusion may be inserted in the recess and thus the base housing body portion 111b may be coupled to the central shaft 111c. Hereinafter, for convenience of description, a case where the base housing body portion 111b and the central shaft 111c are separately formed and coupled to each other is mainly described in detail.

The fixed housing 112 may be coupled to the base housing 111. In this case, the fixed housing 112 may be fixed to an outer wall of a building, etc. In this case, the fixed housing 112 may be fixed by using a bolt, a screw, etc. The base housing 111 and the fixed housing 112 may be coupled by using various methods. For example, the base housing 111 and the fixed housing 112 may be coupled by using a bolt, a screw, etc. In another exemplary embodiment, the base housing 111 is rotatably connected to the fixed housing 112 and may be connected by using a hook, etc.

The cover housing 113 is coupled to at least one of the fixed housing 112 and the base housing 111, and may fix the cover 130. In this case, the cover housing 113 may shield a portion of the cover 130, and shield the fixed housing 112 and the base housing 111.

Meanwhile, the lens bracket 120 may be detachably coupled to the rail 111a. The lens bracket 120 may be coupled to be movable along the rail 111a.

The cover 130 may be coupled to the base housing 111 to shield parts arranged between the cover 130 and the base housing 111 from the outside. The cover 130 may include a cover body 131 and a force applying portion 132.

The cover body 131 may be formed in a dome shape and a portion of the cover body 131 may be flat. For example, a portion of the cover body 131 corresponding to a lateral surface of the base housing 111 may be formed as a curved surface, and a surface of the cover body 131 facing the bottom may be flat. The cover body 131 may include a transparent material such as acrylic, glass, and plastic. Also, a sealing member may be arranged between the cover body 131 and the base housing 111 to prevent penetration of external moisture. The cover body 131 and the base housing 111 may be coupled to each other by using various methods. In an exemplary embodiment, the cover body 131 and the base housing 111 may be fixed to each other through a separate clamp, etc. In another exemplary embodiment, a protrusion is provided to one of the cover body 131 and the base housing 111, and a recess or a hole receiving the protrusion is provided in the other of the cover body 131 and the base housing 111. In this case, the protrusion is received in the recess or the hole, and the cover body 131 and the base housing 111 may be coupled to each other.

The force applying portion 132 may protrude from the cover body 131 toward the lens bracket 120. In this case, the force applying portion 132 may be formed as one body with the cover body 131, or formed separately from the cover body 131 and coupled to the cover body 131. In the case where the force applying portion 132 is formed as one body with the cover body 131, the force applying portion 132 may include the same material as that of the cover body 131. In the case where the force applying portion 132 is formed separately from the cover body 131, the force applying portion 132 may be coupled to the cover body 131 by using a separate adhesive member. In this case, the force applying portion 132 may include an elastic material such as rubber, silicon, and plastic. Hereinafter, for convenience of description, a case where the force applying portion 132 is formed separately from the cover body 131 and coupled to the cover body 131 is described in detail.

The lens assembly 140 may be coupled to at least one of the central shaft 111c and the lens bracket 120. In this case, a plurality of lens assemblies 140 may be provided. One of the lens assemblies 140 may be coupled to the central shaft 111c, and the rest of the lens assemblies 140 may be coupled to the lens bracket 120. In this case, a plurality of lens bracket 120 may be provided to respectively correspond to the plurality of lens assemblies 140.

Figure 4:
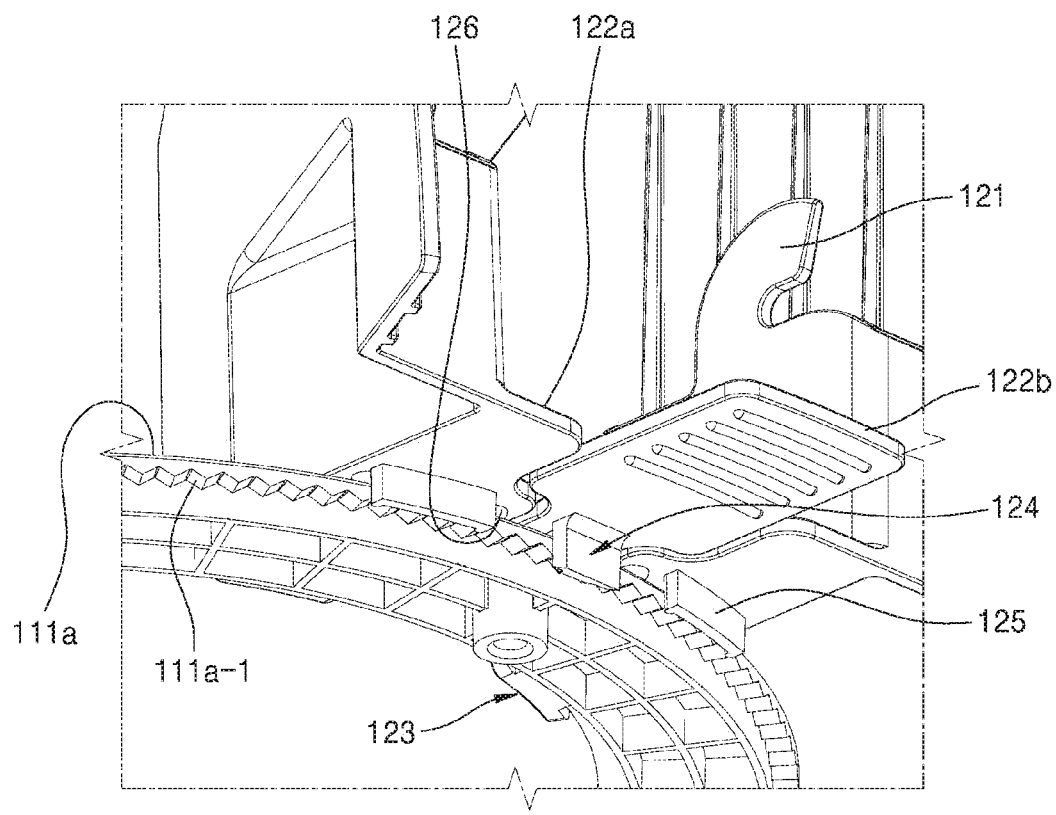
FIG. 4 is a partial perspective view of a back surface of a lens bracket and a back surface of a rail shown in FIG. 3.
Figure 5:
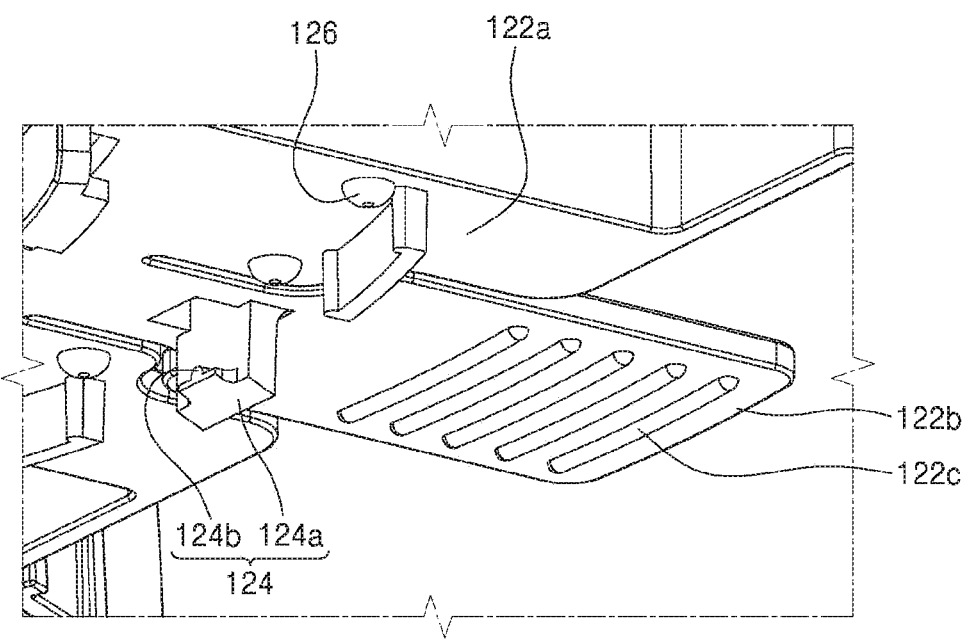
FIG. 5 is a partial perspective view of a back surface of a lens bracket shown in FIG. 2.
Figure 6:
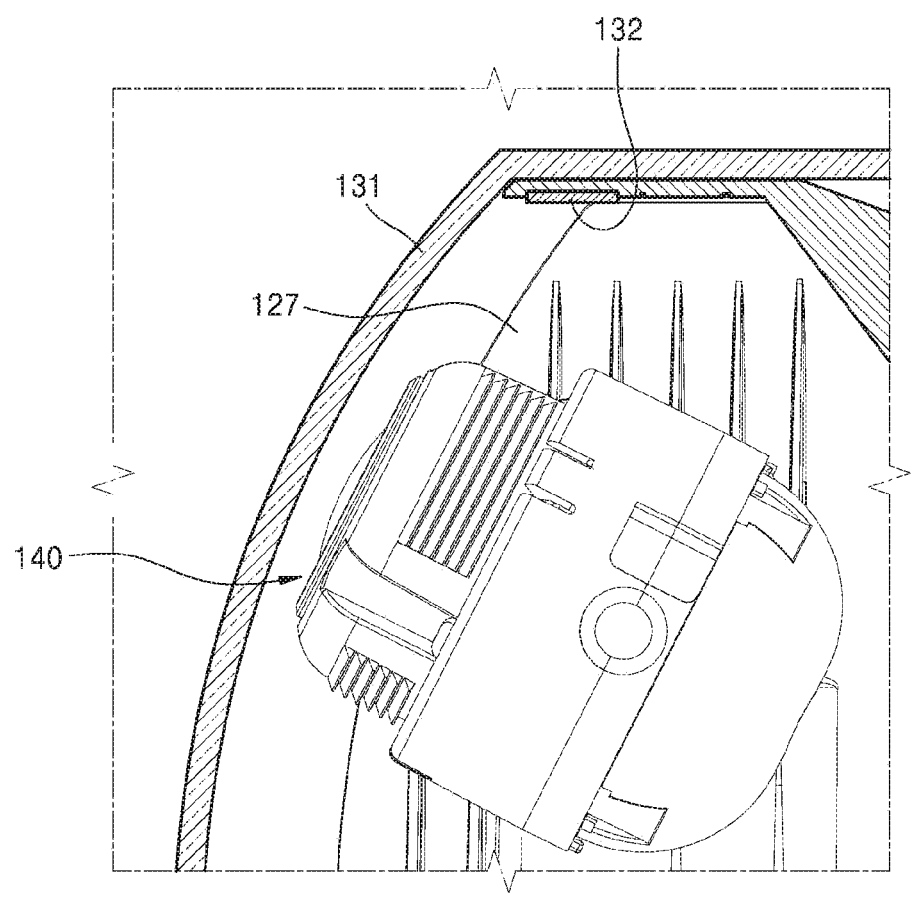
FIG. 6 is a cross-sectional view of a portion of the surveillance camera shown in FIG. 1.
Figure 6:
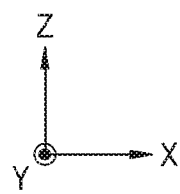

FIG. 3 is a perspective view of a lens bracket and a rail shown in FIG. 2, FIG. 4 is a partial perspective view of a back surface of a lens bracket and a back surface of a rail shown in FIG. 3, FIG. 5 is a partial perspective view of a back surface of a lens bracket shown in FIG. 2, and FIG. 6 is a cross-sectional view of a portion of the surveillance camera shown in FIG. 1.

Referring to FIGS. 3 to 6, the lens bracket 120 may include a fixed portion 121, a moving portion 122, a coupling protrusion 123, a hooking portion 124, a guide 125, a contact protrusion 126, and a partition wall 127.

The lens assembly 140 may be received and fixed in the fixed portion 121. In this case, the fixed portion 121 may protrude from the moving portion 122 toward the cover 130. The fixed portion 121 may be connected with the lens assembly 140 by using various methods. For example, the fixed portion 121 may include a hole to receive a portion of the lens assembly 140. When a portion of the lens assembly 140 is received in the hole, the fixed portion 121 may be coupled to the lens assembly 140. In another exemplary embodiment, the fixed portion 121 may include a receiving recess 121a from which a portion of the lens assembly 140 is separable depending on a direction thereof. In this case, when a portion of the lens assembly 140 is received in/separated from the receiving recess 121a, the fixed portion 121 may be coupled to/separated from the lens assembly 140. In another exemplary embodiment, the lens assembly 140 may be rotatably fixed to the fixed portion 121 by using a pin, etc. Hereinafter, for convenience of description, a case where the receiving recess 121a is formed in the fixed portion 121 such that the lens assembly 140 is coupled to the fixed portion 121 is mainly described.

The moving portion 122 may include a moving body 122a and a knob 122b. The moving body 122a may be parallel to a front surface (e.g. a surface facing a surface on which the rail protrusion 111a-1 is formed) of the rail 111a. Also, the moving body 122a may be formed as a portion of a fan shape having a diameter that is the same as or similar to a diameter of the rail 111a. That is, a shape of the moving body 122a may be the same as or similar to a shape of a portion of the rail 111a. The knob 122b may be separated from the moving body 122a, and one end of the knob 122b may be connected with the moving body 122a. In this case, when force is exerted on the knob 122b, the knob 122b may rotate a preset distance around the moving body 122a. Also, a nonslip portion 122c may be arranged on a surface of the knob 122b. The nonslip portion 122c may include a plurality of nonslip protrusions spaced apart from each other. In another exemplary embodiment, the nonslip portion 122c may include a protrusion on the surface of the knob 122b. In another exemplary embodiment, roughness of the nonslip portion 122c may be greater than that of other portions of the knob 122b. Hereinafter, for convenience of description, a case where the nonslip portion 122c includes nonslip protrusions is mainly described in detail. The nonslip portion 122c may be arranged on at least one surface of the knob 122b. For example, the nonslip portion 122c may be arranged on at least one of a front surface and a back surface of the knob 122b. Hereinafter, for convenience of description, a case where the nonslip portion 122c is arranged on both the front surface and the back surface of the knob 122b is mainly described in detail.

The coupling protrusion 123 may be arranged on the moving portion 122 to surround an inner surface of the rail 111a. In this case, the coupling protrusion 123 may be bent to surround the inner surface and a back surface of the rail 111a. At least one coupling protrusion 123 may be provided. Particularly, in the case where a plurality of coupling protrusions 123 are provided, the plurality of coupling protrusions 123 may be spaced apart from each other on a back surface of the moving portion 122. Hereinafter, for convenience of description, a case where two coupling protrusions 123 are provided is mainly described in detail. In this case, a distance between the two coupling protrusions 123 may be greater than a width of a portion of the knob 122b connected to the moving body 122a.

The hooking portion 124 may be arranged on the knob 122b. In this case, the hooking portion 124 may be arranged between the two coupling protrusions 123. In this case, the hooking portion 124 and the two coupling protrusions 123 may be arranged in a triangular shape. The hooking portion 124 may include a hooking connection portion 124a at least partially bent to surround an outer surface and a back surface of the rail 111a. In this case, the hooking connection portion 124a may be formed similar to the coupling protrusion 123. The hooking portion 124 may include a location fixing protrusion 124b protruding toward the rail protrusion 111a-1. The location fixing protrusion 124b may contact a back surface of the rail 111a while the moving portion 122 moves. Particularly, the location fixing protrusion 124b may contact the rail protrusion 111a-1 or enter between adjacent rail protrusions 111a-1 while the moving portion 122 moves. The location fixing protrusion 124b may not only prevent a velocity of the moving portion 122 from being too fast while the moving portion 122 moves, but also fix a location of the moving portion 122 to some degree after the moving portion 122 moves.

The guide 125 may protrude from the moving body 122a toward the rail 111a. In this case, the guide 125 may be arranged on a lateral surface of the moving body 122a on which the hooking portion 124 is arranged. The guide 125 may shield a lateral surface of the rail 111a. The guide 125 may be formed in various shapes. In an exemplary embodiment, the guide 125 may be arranged on an entire lateral surface of the moving body 122a. In another exemplary embodiment, a plurality of guides 125 may be provided. The plurality of guides 125 may be spaced apart from each other on the lateral surface of the moving body 122a. Hereinafter, for convenience of description, a case where the plurality of guides 125 are provided and the plurality of guides 125 are spaced apart from each other is mainly described in detail.

The contact protrusion 126 may be arranged on a back surface of the moving body 122a. In this case, the contact protrusion 126 may protrude from a back surface of the moving body 122a toward the rail 111a. The contact protrusion 126 may point-contact or plane-contact the rail 111a when the moving portion 122 stops. A plurality of contact protrusions 126 may be provided, and the plurality of contact protrusions 126 may be spaced apart from each other on the moving body 122a. When the moving portion 122 is seated on the rail 111a, the contact protrusion 126 may allow the location fixing protrusion 124b to contact the rail protrusion 111a-1 or a back surface of the rail 111a between adjacent rail protrusions 111a-1.

The partition wall 127 may be formed as one body with the moving portion 122 or formed separately from the moving portion 122. In the case where the partition wall 127 is formed separately from the moving portion 122, the partition wall 127 may be formed similar to the moving portion 122, coupled to the rail 111a, and may linearly move along the rail 111a. For example, similarly to the lens bracket 120, the partition wall 127 may include the fixed portion 121, the moving portion 122, the coupling protrusion 123, the hooking portion 124, the guide 125, and the contact protrusion 126. Hereinafter, for convenience of description, a case where the partition wall 127 is formed as one body with the moving portion 122 is mainly described in detail.

The partition wall 127 may be connected to the fixed portion 121. Also, the partition wall 127 may protrude from the moving body 122a toward the cover 130. A pair of partition walls 127 may be provided to face each other around the moving portion 122. In this case, the pair of partition walls 127 may block a portion of light incident to the lens assembly 140 installed to the moving portion 122. The partition wall 127 may be arranged radially around the lens assembly 140. For example, each partition wall 127 may be arranged to face a center of the rail 111a.

Meanwhile, the lens bracket 120 may be separated from the rail 111a. Particularly, in the case where the plurality of lens brackets 120 are arranged on the rail 111a, at least one of the plurality of lens brackets 120 may be removed from the rail 111a so as to change a location of the lens assembly 140 or adjust the number of lens assemblies 140, etc.

Specifically, as a method of removing the lens bracket 120 from the rail 111a, force may be exerted on the knob 122b in a direction away from a front surface of the rail 111a. In this case, the knob 122b may be bent from the moving body 122a in a direction away from the front surface of the rail 111a. The hooking portion 124 may be detached from the rail 111a together with the knob 122b. For example, when the knob 122b is bent as described above, a portion of the hooking connection portion 124a may move from the back surface of the rail 111a to an outer peripheral direction of the rail 111a. In this case, the hooking connection portion 124a may open the back surface and a portion of the lateral surface of the rail 111a. Also, the location fixing protrusion 124b may be completely detached from the back surface of the rail 111a. Also, while the knob 122b rotates constantly as described above, the lens bracket 120 may rotate around the coupling protrusion 123 and may be spaced apart from the rail 111a. After that, the coupling protrusion 123 may be separated from the rail 111a by moving the lens bracket 120 in a central direction of the rail 111a. A place where the lens bracket 120 is separated from the rail 111a may be a first recess 111b-1 of the base housing 111 as described above.

One of the plurality of lens brackets 120 may be separated as described above, or at least one of the plurality of lens brackets 120 may be moved on the rail 111a with the plurality of lens brackets 120 arranged on the rail 111a.

A method of moving the lens assembly 140 through the lens bracket 120 is described. The lens bracket 120 may be coupled to the rail 111a and may move along the rail 111a. In this case, a user may exert force on the knob 122b toward the rail 111a. In this case, the knob 122b may be bent toward the front surface of the rail 111a while approaching the front surface of the rail 111a, and the hooking portion 124 may move together with the knob 122b. In this case, the location fixing protrusion 124b of the hooking portion 124 may be detached from the rail protrusion 111a-1 on the back surface of the rail 111a, or drawn from a recess between the rail protrusions 111a-1. In the case where the hooking portion 124 moves as described above, since restriction between the location fixing protrusion 124b and the rail protrusion 111a-1 is released, the lens bracket 120 may freely move along the rail 111a. Besides this case, a user may move the lens bracket 120 on the rail 111a without exerting force on the knob 122b. Specifically, in the case where a user moves the lens bracket 120 on the rail 111a, the location fixing protrusion 124b may contact an outer surface of the rail protrusion 111a-1 while moving with the lens bracket 120. In this case, a location of the location fixing protrusion 124b may be varied by the rail protrusion 111a-1, and the knob 122b may be bent a preset distance depending on the location of the location fixing protrusion 124b. For example, when the location fixing protrusion 124*b* reaches a point at which a thickness of the rail protrusion 111*a*-1 is greatest, the knob 122*b* may be bent toward the rail 111*a*. When the location fixing protrusion 124*b* is arranged in a recess between the rail protrusions 111*a*-1, the knob 122*b* may be restored to its original state. In this case, while the lens bracket 120 rotates, a location of the lens bracket 120 on the rail 111*a* does not move swiftly due to the location fixing protrusion 124*b*, but the location of the lens bracket 120 may be prevented from varying too fast.

The contact protrusion 126 may prevent the lens bracket from moving in fast velocity. Specifically, in the case where the lens bracket 120 moves on the rail 111*a*, since the contact protrusion 126 may be arranged to face the location fixing protrusion 124*b*, the contact protrusion 126 may exert force on the moving portion 122 in an opposite direction of the location fixing protrusion 124*b*. Particularly, while the lens bracket 120 moves on the rail 111*a*, the contact protrusion 126 may provide frictional force to the lens bracket 120 during movement of the lens bracket 120 by contacting a front surface of the rail 111*a*. Also, the contact protrusion 126 may contact a front surface of the rail 111*a* while the location fixing protrusion 124*b* moves along an outer surface of the rail protrusion 111*a*-1. Besides the above case, the contact protrusion 126 may contact the front surface of the rail 111*a* in the case where a user exerts force on the knob 122*b* toward the rail 111*a*. Due to this contact, the contact protrusion 126 may prevent a velocity of the lens bracket 120 from being too fast and thus prevent a location of the lens bracket 120 from rapidly changing by providing frictional force of some degree to the lens bracket 120 during movement of the lens bracket 120. In the case where the lens bracket 120 stops, the contact protrusion 126 may fix a location of the lens bracket 120. Specifically, in the case where the lens bracket 120 stops, the location fixing protrusion 124*b* may be arranged between adjacent rail protrusions 111*a*-1. In this case, since a distance between an end of the location fixing protrusion 124*b* and an end of the contact protrusion 126 is less than a distance between the front surface of the rail 111*a* and a point at which a thickness of the rail protrusion 111*a*-1 is greatest, when the lens bracket 120 moves, the location fixing protrusion 124*b* may be prevented from moving along an outer surface of the rail protrusion 111*a*-1 to some degree. Particularly, in this case, in the case where force of a preset magnitude or more is not exerted on the lens bracket 120, the lens bracket 120 may not move on the rail 111*a*.

Meanwhile, a user may arrange the lens assembly 140 on the lens bracket 120, and then arrange the lens bracket 120 on the rail 111*a*. A method of coupling the lens bracket 120 on the rail 111*a* is described. The lens bracket 120 is arranged on the rail 111*a*, and then force is applied from the front surface of the rail 111*a* to the lens bracket 120, or one of the coupling protrusion 123 and the hooking portion 124 is coupled to the rail 111*a* first, and then the lens bracket 120 may be rotated and coupled on the rail 111*a*. Specifically, in the case where the lens bracket 120 is arranged on the rail 111*a* and then force is applied to the lens bracket 120, while the coupling protrusion 123 and the hooking portion 124 are bent in opposite directions, respectively, the lens bracket 120 may be coupled on the rail 111*a*. In this case, since the coupling protrusion 123 and the hooking portion 124 have elastic force themselves, at least one of an end of the coupling protrusion 123 and an end of the hooking portion 124 may rotate around the lens bracket 120. Also, since the hooking portion 124 is connected to the knob 122*b*, in the above case, the knob 122*b* may rotate around the moving body 122*a* and a distance between the hooking portion 124 and the coupling protrusion 123 may vary. In another exemplary embodiment, one of the coupling protrusion 123 and the hooking portion 124 is coupled on the rail 111*a*, and then the lens bracket 120 may be rotated and coupled on the rail 111*a*. First, after the coupling protrusion 123 is coupled on the rail 111*a*, the lens bracket 120 may be rotated around the coupling protrusion 123. In this case, a user may increase a distance between the hooking portion 124 and the coupling protrusion 123 by bending the knob 122*b* in an opposite direction to a rotation direction of the lens bracket 120. Also, in the case where the hooking portion 124 is coupled on the rail 111*a* first, a user may rotate the lens bracket 120 around the hooking portion 124. In this case, in the case the coupling protrusion 123 contacts the rail 111*a*, since a location of the knob 122*b* varies, a distance between the coupling protrusion 123 and the hooking portion 124 may vary, and thus the lens bracket 120 may be coupled on the rail 111*a*.

After a location of the lens bracket 120 is varied, the lens bracket 120 may fix the location of the lens assembly 140. In this case, besides the contact protrusion 126 and the location fixing protrusion 124*b*, the lens bracket 120 may be fixed through the cover 130 after being coupled to the base housing 111.

Specifically, when the arrangement of the lens bracket 120 is completed, the lens assembly 140 may be shielded from the outside by coupling the base housing 111 to the cover 130. In this case, when the cover 130 is coupled to the base housing 111, the force applying portion 132 arranged on an inner surface of the cover 130 may contact a portion of the lens bracket 120 to apply force on the lens bracket 120 toward the rail 111*a*. For example, the force applying portion 132 may be arranged to circumnavigate an inner surface of a flat portion of the cover 130. In this case, when the cover 130 is coupled to the base housing 111, the force applying portion 132 may contact at least one of the fixed portion 121 and the partition wall 127 of the lens bracket 120 and apply force on the at least one of the fixed portion 121 and the partition wall 127. In this case, a thickness of the force applying portion 132 may be greater than a distance between an end of one of the fixed portion 121 and the partition wall 127, and the inner surface of the flat portion of the cover 130. In the case where the cover 130 is coupled to the base housing 111, the force applying portion 132 may prevent the lens bracket 120 from moving along the rail 111*a* due to external force, etc. by applying force on one of the fixed portion 121 and the partition wall 127 toward the rail 111*a*.

Therefore, the lens bracket 120 may be installed on the rail 111*a* swiftly and easily. Also, a location of the lens bracket 120 may be prevented from varying too fast when the lens bracket 120 moves along the rail 111*a*. The location of the lens bracket 120 may be easily varied on the rail 111*a*.

In the surveillance camera 100, the lens bracket 120 may be replaced swiftly and easily. Also, in the surveillance camera 100, at least one of the plurality of lens brackets 120 may be separated from the rail 111*a*, and then the rest of the plurality of lens brackets 120 may be arranged on a desired location on the rail 111*a*.

In the surveillance camera 100, since a location of the lens bracket 120 may be varied and then fixed solidly, a user may obtain an image at a desired location.

Figure 7:
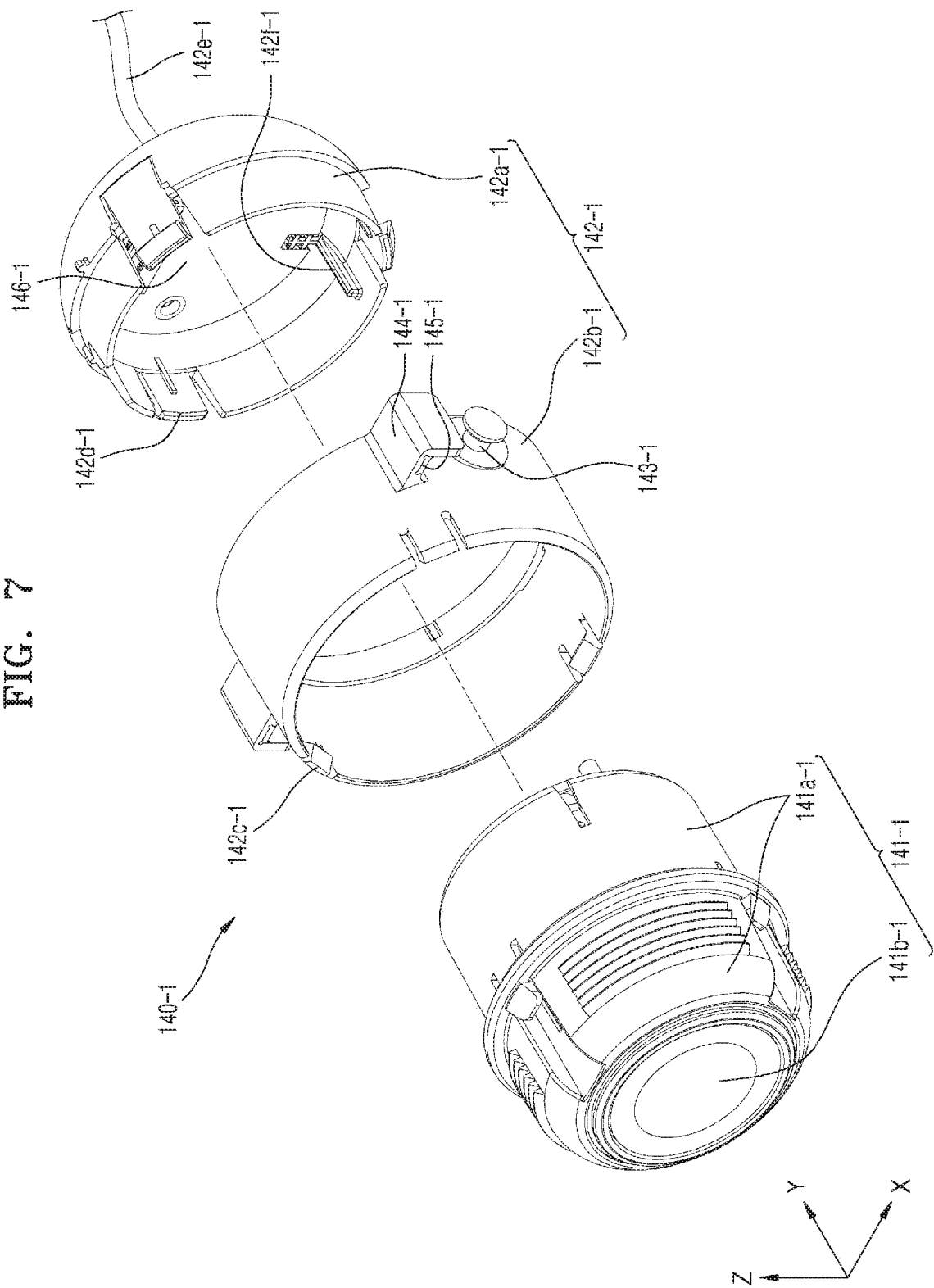
FIG. 7 is an exploded perspective view of a first lens assembly shown in FIG. 2.
Figure 8:
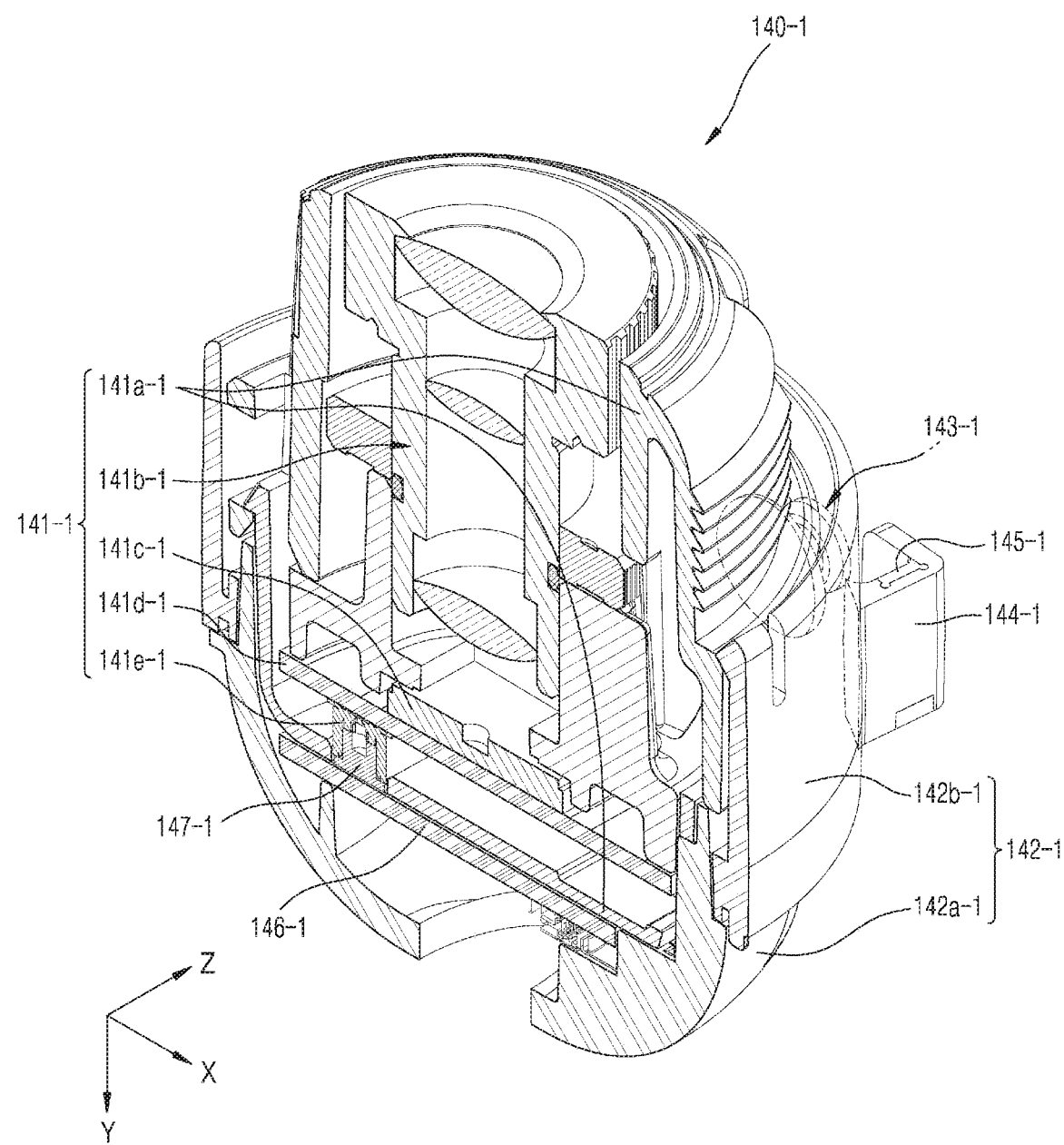
FIG. 8 is a cross-sectional view of the first lens assembly shown in FIG. 7.

FIG. 7 is an exploded perspective view of a first lens assembly shown in FIG. 2, and FIG. 8 is a cross-sectional view of the first lens assembly shown in FIG. 7.

Referring to FIGS. 7 and 8, a plurality of lens assemblies (one of which is shown in FIGS. 7-8) may be provided. In this case, the plurality of lens assemblies may include at least one lens, a first lens assembly 140-1 and a second lens assembly (not shown in FIGS. 7-8), respectively, having different resolutions. In this case, the first lens assembly 140-1 and the second lens assembly may be substantially the same in size. Also, the first lens assembly 140-1 may be replaced by the second lens assembly, and one of the first lens assembly 140-1 and the second lens assembly may be coupled to one of a lens bracket and a central shaft to which the other of the first lens assembly 140-1 and the second lens assembly is coupled. The first lens assembly 140-1 and the second lens assembly may be formed the same or similar to each other. Hereinafter, the first lens assembly 140-1 is described in detail.

The first lens assembly 140-1 may include a first lens module 141-1, a first lens housing 142-1, a first rotational shaft 143-1, a first stopper 144-1, a first rotation prevention portion 145-1, a first housing circuit board 146-1, and a first housing connector 147-1. In this case, the first lens module 141-1, the first lens housing 142-1, the first rotational shaft 143-1, the first stopper 144-1, and the first rotation prevention portion 145-1 may be formed as one body, or only some of them may be formed as one body. Also, the first lens module 141-1, the first lens housing 142-1, the first rotational shaft 143-1, the first stopper 144-1, and the first rotation prevention portion 145-1 may be formed separately.

The first lens module 141-1 may include a first lens case 141a-1, a first lens unit 141b-1 including at least one lens arranged inside the first lens case 141a-1, and a first sensor 141c-1 arranged inside the first lens case 141a-1 and configured to sense an image incident through the first lens unit 141b-1. In this case, the first lens case 141a-1 may be provided as a plurality of first lens cases, and the plurality of first lens cases 141a-1 may be coupled to each other through a hook, etc. The first lens module 141-1 may include a first sensor circuit board 141d-1 on which the first sensor 141c-1 is arranged, and a first substrate connector 141e-1 connected to the first sensor circuit board 141d-1. In this case, the first sensor circuit board 141d-1 may be coupled to the first lens unit 141b-1. The first substrate connector 141e-1 may be coupled to the first lens case 141a-1, and partially exposed to the outside.

The first lens module 141-1 may be arranged on the first lens housing 142-1. The first lens housing 142-1 may be formed as one element, and may be separated into a plurality of parts and formed as the plurality of parts. Hereinafter, for convenience of description, a case where the first lens housing 142-1 is formed as a plurality of parts is mainly described in detail.

The first lens housing 142-1 may include a first bottom housing 142a-1 receiving the first lens case 141a-1 and coupled to the first lens case 141a-1, and a first top housing 142b-1 arranged to surround the first bottom housing 142a-1 and coupled to the first bottom housing 142a-1. In this case, the first bottom housing 142a-1 may include a lens case guide 142f-1 configured to guide movement of the first lens case 141a-1 while the first lens case 141a-1 is received. The lens case guide 142f-1 may be formed in a lengthwise direction of the first bottom housing 142a-1 (or a reception direction of the first lens assembly 140-1).

The first lens case 141a-1, the first bottom housing 142a-1, and the first top housing 142b-1 may be coupled by using various methods. For example, the first lens case 141a-1, the first bottom housing 142a-1, and the first top housing 142b-1 may be coupled by using a fastener such as a screw, a bolt, etc. In another exemplary embodiment, the first lens case 141a-1, the first bottom housing 142a-1, and the first top housing 142b-1 may be coupled by using a coupling protrusion or a coupling hook and a coupling recess or a coupling hole receiving the coupling protrusion or the coupling hook. In another exemplary embodiment, the first lens case 141a-1, the first bottom housing 142a-1, and the first top housing 142b-1 may be coupled by using a ring member, etc. In this case, a method of coupling the first lens case 141a-1, the first bottom housing 142a-1, and the first top housing 142b-1 is not limited thereto, and may include coupling methods through all structures and apparatuses through which different members may be coupled. Hereinafter, for convenience of description, a case where the first lens case 141a-1, the first bottom housing 142a-1, and the first top housing 142b-1 are coupled through a hook and a hole is mainly described in detail.

The first lens case 141a-1 may be received in the first bottom housing 142a-1. The first bottom housing 142a-1 may be received in the first top housing 142b-1. In this case, the first bottom housing 142a-1 may include a first coupling hook 142d-1 hooked at a bank of the first top housing 142b-1. The first top housing 142b-1 may include a second coupling hook 142c-1 hooked at a bank of the first lens case 141a-1. Also, the first bottom housing 142a-1 may be rotatably coupled to the first top housing 142b-1. Therefore, the first lens assembly 140-1 and the first bottom housing 142a-1 may rotate on their axis inside the first top housing 142b-1.

The first rotational shaft 143-1 may be formed in the first lens module 141-1. For example, the first rotational shaft 143-1 may protrude from the first top housing 142b-1. In this case, the first rotational shaft 143-1 may be received in the receiving recess 121a of the fixed portion 121, and a diameter of an end of the first rotational shaft 143-1 may be greater than a diameter of other portions of the first rotational shaft 143-1.

The first stopper 144-1 may protrude from the first lens housing 142-1. Particularly, the first stopper 144-1 may be formed on the first top housing 142b-1.

The first stopper 144-1 may have a long side in a lengthwise direction of the first lens module 141-1 (or a direction in which light is incident to the lens module 141, an optical axis direction of the first lens unit 141b-1, a first direction). In an exemplary embodiment, since a portion of the first stopper 144-1 is bent, the first stopper 144-1 may shield at least two surfaces of the fixed portion 121. For example, the first stopper 144-1 may shield a lateral surface and a top surface of the fixed portion 121. Therefore, the first stopper 144-1 may prevent the first lens module 141-1 from shaking while the first lens module 141-1 rotates. In another exemplary embodiment, the first stopper 144-1 may be formed as a plane perpendicular to the top surface of the fixed portion 121. In this case, a portion of the first stopper 144-1 (shown in FIG. 7) arranged over the lateral portion of the fixed portion 121 may not be present.

The first stopper 144-1 may limit a separation angle by which the first lens assembly 140-1 is separated from the fixed portion 121 in the case where the first lens assembly 140-1 rotates. For example, in the case where the first lens assembly 140-1 is within a specific angle range, the first stopper 144-1 contacts with the fixed portion 121 and may prevent the first rotational shaft 143-1 from being drawn from the receiving recess 121a. In this case, the specific angle range may include an angle at which light incident to the first lens assembly 140-1 is not blocked by at least one of the base housing, the fixed housing, and the cover housing. For example, the specific angle range may be a range within about 180° from an arbitrary point at which at least one of the base housing, the fixed housing, and the cover housing meets the cover. That is, in the case where an optical axis of the first lens unit 141b-1 is arranged on a plane parallel to a top surface of the base housing or below the plane, the first lens assembly 140-1 may be separated from the fixed portion 121. In this case, an angle of the first lens assembly 140-1 may be measured in one of a clockwise direction and a counterclockwise direction based on a case where the optical axis of the first lens unit 141b-1 is arranged such that the optical axis is parallel to the top surface of the base housing.

Also, the first stopper 144-1 may separate the first lens assembly 140-1 from the fixed portion 121 in only the first direction in which the receiving recess 121a is formed. Furthermore, the first stopper 144-1 may limit a separation angle range of the lens assembly 140-1 depending on a size of the receiving recess 121a. For example, in the case where the first lens assembly 140-1 reaches within the separation angle range excluding the specific angle range described above, when the first lens assembly 140-1 is drawn from the fixed portion 121, since progression of the first stopper 144-1 does not interfere with the fixed portion 121a, the first rotational shaft 143-1 may be separated from the receiving recess 121a. In this case, the separation angle range in which the first lens assembly 140-1 is separated from the fixed portion 121 may be an angle range in which progression of the first stopper 144-1 does not interfere with the fixed portion 121 even though the first lens assembly 140-1 rotates depending on a width of the receiving recess 121a.

The first rotation prevention portion 145-1 may be arranged on at least one of the first stopper 144-1 and the fixed portion 121. In this case, the first rotation prevention portion 145-1 may be formed in various shapes. For example, the first rotation prevention portion 145-1 may include a frictional member arranged on at least one of the first stopper 144-1 and the fixed portion 121. In this case, the frictional member may include rubber, silicon, etc. In another exemplary embodiment, the first rotation prevention portion 145-1 may include a protrusion arranged on a surface of at least one of the first stopper 144-1 and the fixed portion 121. In this case, the first rotation prevention portion 145-1 may include a fine protrusion such that a portion of at least one of the first stopper 144-1 and the fixed portion 121 on which the first stopper 144-1 and the fixed portion 121 contact each other is rougher than the other portions. The first rotation prevention portion 145-1 may include sawteeth respectively arranged in the first stopper 144-1 and the fixed portion 121.

The first housing circuit board 146-1 may be arranged on the first bottom housing 142a-1. In this case, the first housing circuit board 146-1 may be connected with the first substrate connector 141e-1 through the first housing connector 147-1. Also, the first housing connector 147-1 may be connected to a first cable 142e-2.

Figure 9:
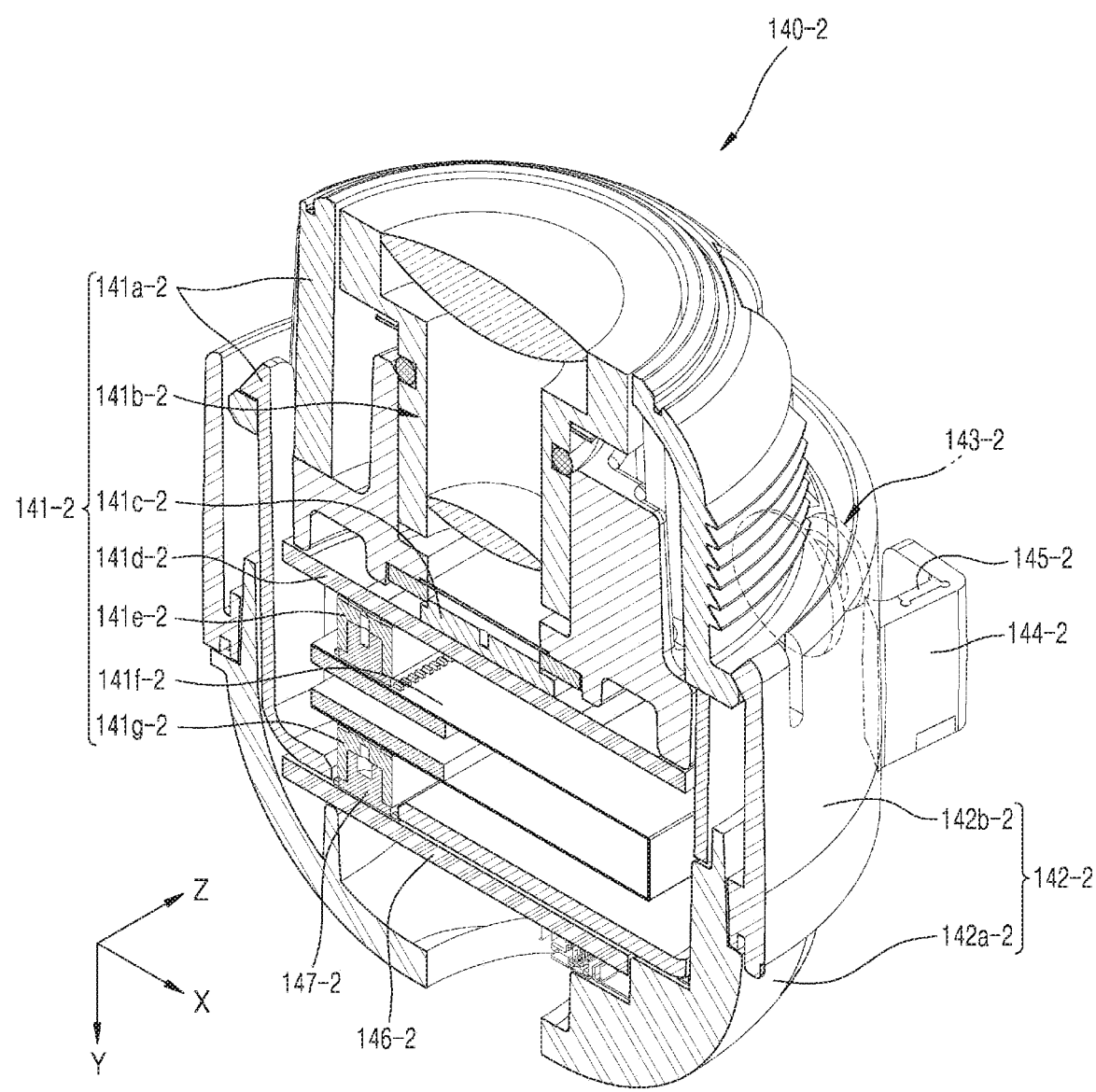
FIG. 9 is a cross-sectional view of a second lens assembly shown in FIG. 2.

FIG. 9 is a cross-sectional view of a second lens assembly 140-2 shown in FIG. 2.

Referring to FIG. 9, the second lens assembly 140-2 may include a second lens module 141-2, a second lens housing 142-2, a second rotational shaft 143-2, a second stopper 144-2, a second rotation prevention portion 145-2, a second housing circuit board 146-2, and a second housing connector 147-2. In this case, since the second lens housing 142-2, the second rotational shaft 143-2, the second stopper 144-2, the second rotation prevention portion 145-2, the second housing circuit board 146-2, and the second housing connector 147-2 are similar to the first lens housing 142-1, the first rotational shaft 143-1, the first stopper 144-1, the first rotation prevention portion 145-1, the first housing circuit board 146-1, and the first housing connector 147-1 described with reference to FIGS. 7 and 8, detailed descriptions thereof are omitted to avoid redundancy.

The second lens module 141-2 may have substantially the same size as the first lens module 141-1 as described with reference to FIGS. 7 and 8. The second lens module 141-2 may include a second lens case 141a-2, a second lens unit 141b-2, a second sensor 141c-2, a second sensor circuit board 141d-2, a second substrate connector 141e-2, a second flexible circuit board 141f-2, and an external contact connector 141g-2. In this case, since the second lens case 141a-2, the second lens unit 141b-2, the second sensor 141c-2, the second sensor circuit board 141d-2, and the second substrate connector 141e-2 are the same as or similar to the first lens case 141a-1, the first lens unit 141b-1, the first sensor 141c-1, the first sensor circuit board 141d-1, and the first substrate connector 141e-1, detailed descriptions thereof are omitted to avoid redundancy.

The second lens housing 142-2 may include a second bottom housing 142a-2 and a second top housing 142b-2. In this case, the second bottom housing 142a-2 and the second top housing 142b-2 may be formed the same as or similar to the first bottom housing 142a-1 and the first top housing 142b-1 described with reference to FIGS. 7 and 8.

The second flexible circuit board 141f-2 may be connected with the second substrate connector 141e-2 and the second housing connector 147-2. In this case, the external contact connector 141g-2 may be arranged on opposite ends of the second flexible circuit board 141f-2. The external contact connector 141g-2 may be connected to the second substrate connector 141e-2 and the second housing connector 147-2. The second flexible circuit board 141f-2 may be bent at least one time and arranged inside the second lens case 141a-2. Particularly, the first lens unit 141b-1 and the second lens unit 141b-2 may have different sizes (or lengths). On the other hand, the first lens case 141a-1 and the second lens case 141a-2 may have substantially the same sizes (or lengths). In this case, the first substrate connector 141e-1 may be or may not be exposed to the outside of the first lens case 141a-1 depending on the size of the first lens unit 141b-1. Also, the second substrate connector 141e-2 may be or may not be exposed to the outside of the second lens case 141a-2 depending on the size of the second lens unit 141b-2. In this case, the size of the first lens unit 141b-1 and the size of the second lens unit 141b-2 may be different depending on resolutions of the respective lens unit. For example, in the case where the first lens unit 141b-1 and the second lens unit 141b-2 have different resolutions, the size of one of the first lens unit 141b-1 and the second lens unit 141b-2 may be greater than the size of the other as the resolution of the one of the lens unit is high. Hereinafter, for convenience of description, a case where the resolution of the first lens unit 141b-1 is greater than the resolution of the second lens unit 141b-2, and the size of the first lens unit 141b-1 is greater than the size of the second lens unit 141b-2 is mainly described in detail.

In the case where the size of the first lens unit 141b-1 is greater than the size of the second lens unit 141b-2, when the second lens unit 141b-2 is received inside the second lens case 141a-2, the second substrate connector 141e-2 of the second sensor circuit board 141d-2 may not be exposed to the outside of the second lens case 141a-2. In this case, the inside of the second lens case 141a-2 may be filled by arranging the second flexible circuit board 141f-2 between the second substrate connector 141e-2 and the second lens case 141a-2. In this case, the second flexible circuit board 141*f*-2 may support the second sensor circuit board 141*d*-2 by providing elastic force of a preset degree to the second sensor circuit board 141*d*-2. Also, the second flexible circuit board 141*f*-2 may be connected between the second substrate connector 141*e*-2 and the external contact connector 141*g*-2. In this case, the second substrate connector 141*e*-2, the external contact connector 141*g*-2, and the second housing connector 147-2 may be arranged in a line.

Meanwhile, since methods of coupling the first lens assembly and the second lens assembly 140-2 to a lens bracket or a central shaft are the same, a case where the first lens assembly is coupled to the lens bracket or the central shaft is mainly described below in detail.

Figure 10:
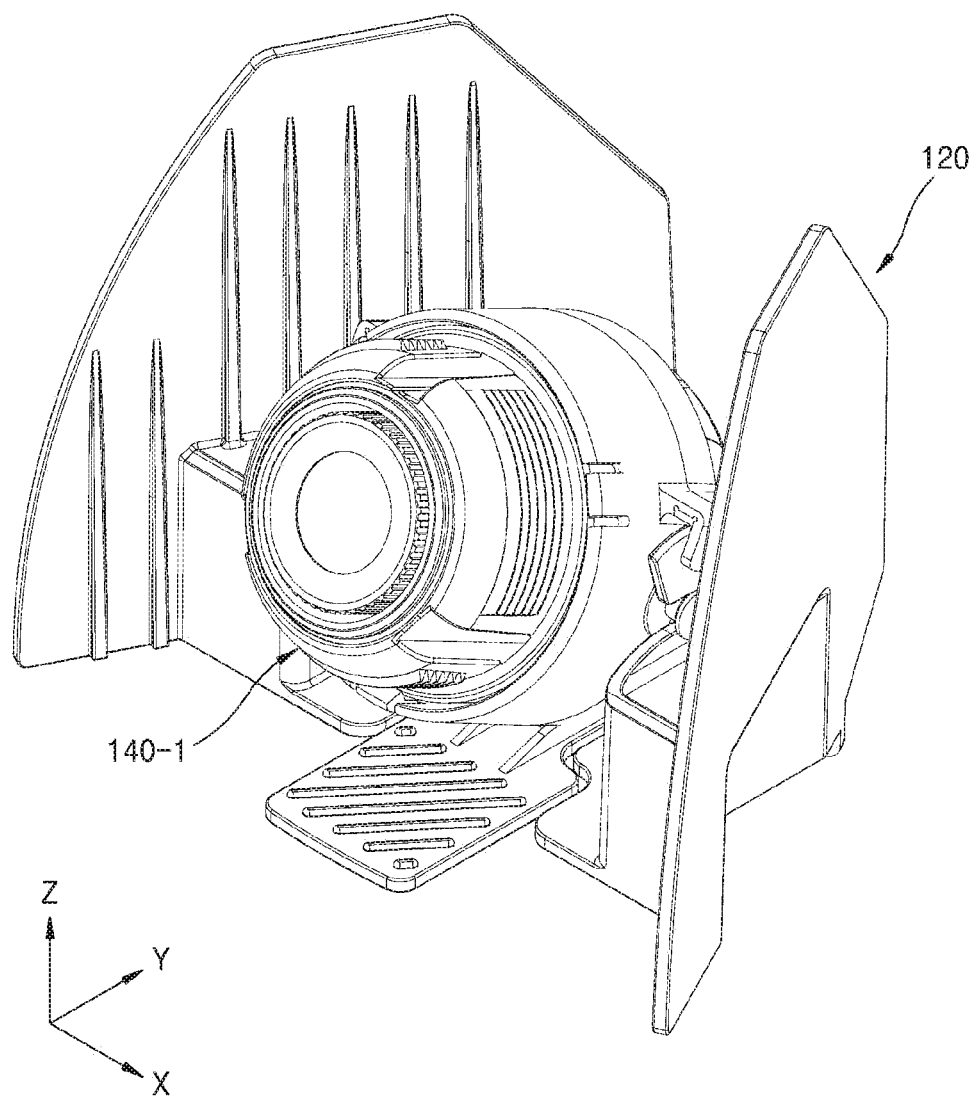
FIG. 10 is a perspective view of a lens bracket and a first lens assembly shown in FIG. 2.
Figure 11A:
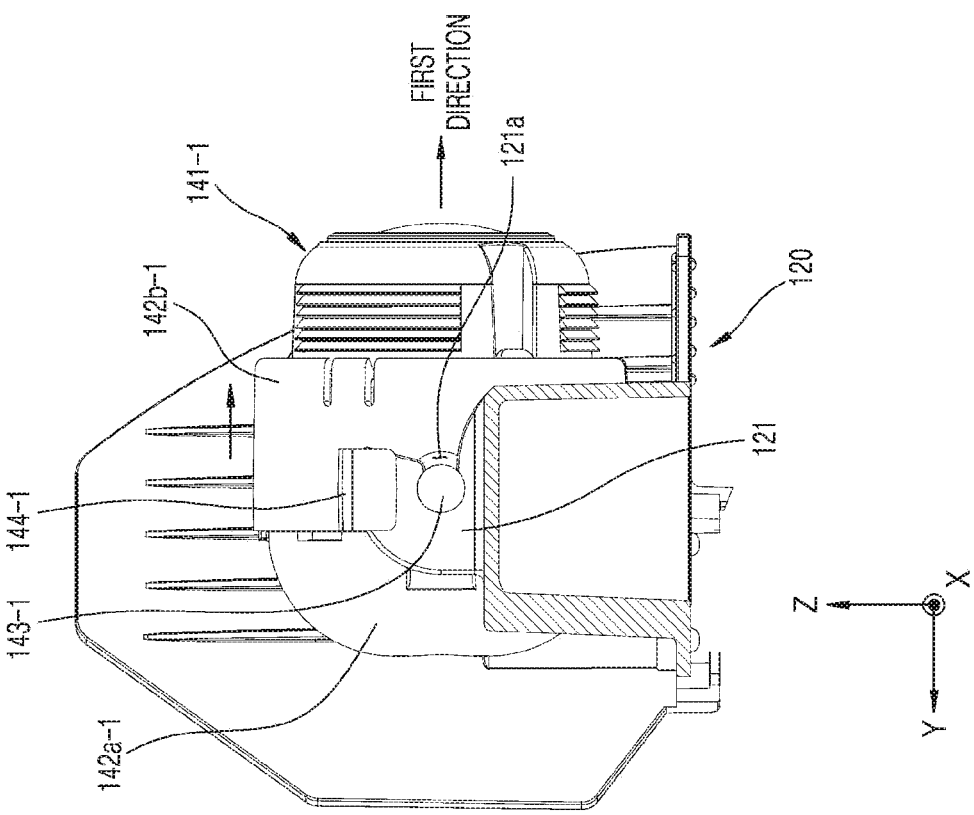
FIGS. 11A and 11B are a side views illustrating coupling between a lens bracket and the first lens assembly shown in FIG. 7.
Figure 11B:
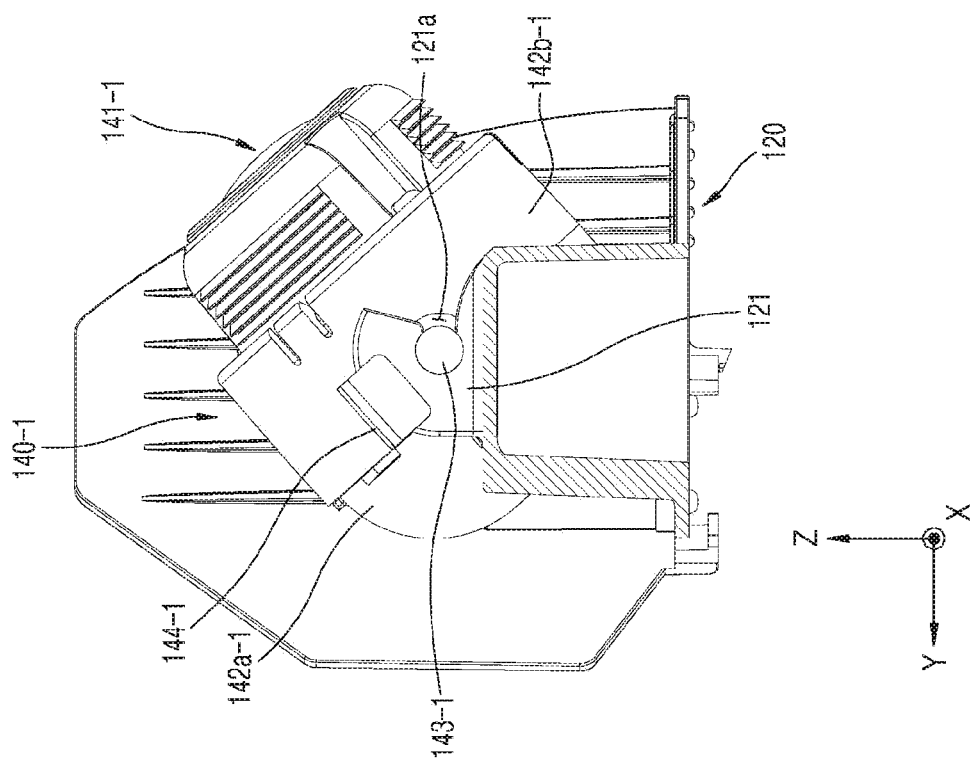

FIG. 10 is a perspective view of a lens bracket and a first lens assembly shown in FIG. 2, and FIGS. 11A and 11B are side views illustrating a coupling between a lens bracket and the first lens assembly shown in FIG. 7.

Referring to FIGS. 10 and 11, the first lens assembly 140-1 may be separated from but arranged on the lens bracket 120. For example, the first rotational shaft 143-1 may be drawn from the receiving recess 121*a* of the fixed portion 121 and received in the inside of the receiving recess 121*a*. In this case, when an optical axis of the first lens unit 141*b*-1 is located within a separation angle range, the first rotational shaft 143-1 may be drawn from the receiving recess 121*a* or received in the receiving recess 121*a*. In the case where the first rotational shaft 143-1 is received, the first stopper 144-1 may contact an outer surface of the fixed portion 121. In this case, since a portion of the first stopper 144-1 contacting the fixed portion 121 is formed in the same direction as the first direction in which the receiving recess 121*a* is formed, the first rotational shaft 143-1 may not interfere with the fixed portion 121 when the first rotational shaft 143-1 is received in or drawn from the receiving recess 121*a*.

An opening of the receiving recess 121*a* in which the first rotational shaft 143-1 is received or from which the first rotational shaft 143-1 is drawn may be formed to guide the first rotational shaft 143-1 to the inside of the receiving recess 121*a*. For example, a size of an outermost portion of the opening of the receiving recess 121*a* may be greater than a size of the inside of the receiving recess 121*a*. In this case, a size of the receiving recess 121*a* may be reduced by a preset length from the opening thereof and then may be constant. That is, since the opening of the receiving recess 121*a* may be wider than the other portions of the receiving recess 121*a*, even when the first rotational shaft 143-1 is received in various directions, the first rotational shaft 143-1 may be easily guided to the inside of the receiving recess 121*a*. Furthermore, since the opening of the receiving recess 121*a* is sloped, the first rotational shaft 143-1 may be guided to a central portion of the receiving recess 121*a*.

After the first rotational shaft 143-1 is received in the receiving recess 121*a*, the first lens assembly 140-1 may be rotated. In this case, the first stopper 144-1 may move along an outer surface of the fixed portion 121. Particularly, the first rotation prevention portion 145-1 may be arranged between the first stopper 144-1 and the fixed portion 121 to contact the outer surface of the fixed portion 121 and thus prevent the first lens assembly 140-1 from rotating too fast, and may fix a location of the first lens assembly 140-1 by preventing the first lens assembly 140-1 from rotating due to the weight of the first lens assembly 140-1 itself in the case where the first lens assembly 140-1 stops rotating.

The outer surface of the fixed portion 121 on which the first stopper 144-1 moves may be curved. For example, the outer surface of the fixed portion 121 on which the first stopper 144-1 moves may have a shape such as a semicircle or a circular arc of a fan shape, and a portion of an ellipse. In this case, the outer surface of the fixed portion 121 may guide a rotation path of the first lens assembly 140-1.

Therefore, the surveillance camera may provide for replacing the lens assembly 140 easily and freely. Also, the surveillance camera allows the lens assembly 140 to be separated within only the separation angle range.

Figure 12:
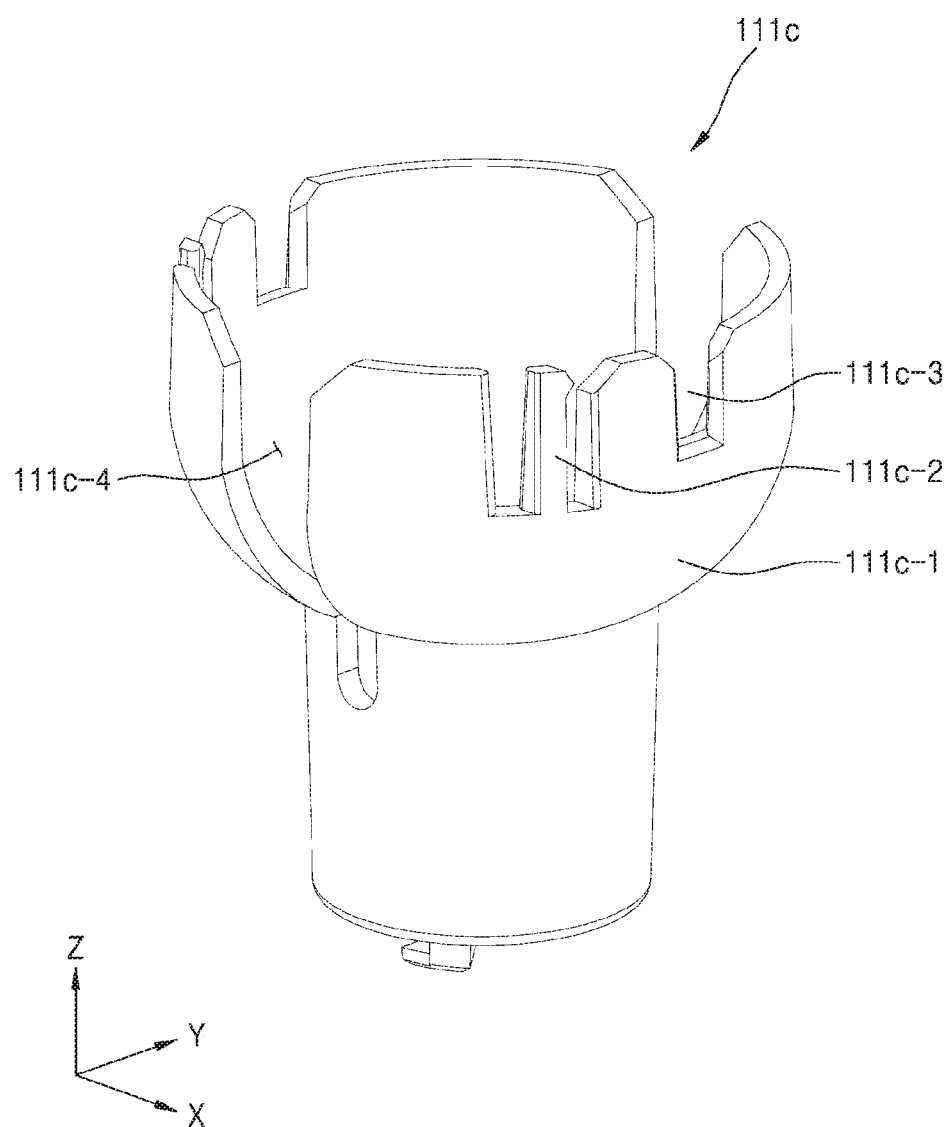
FIG. 12 is a perspective view of a central shaft shown in FIG. 2.
Figure 13A:
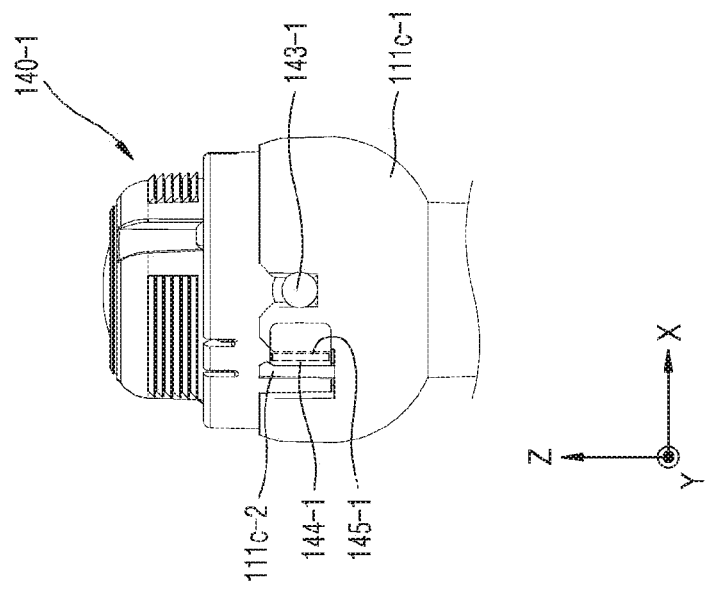
FIGS. 13A and 13B are side views of a first lens assembly coupled to the central shaft shown in FIG. 12.
Figure 13B:
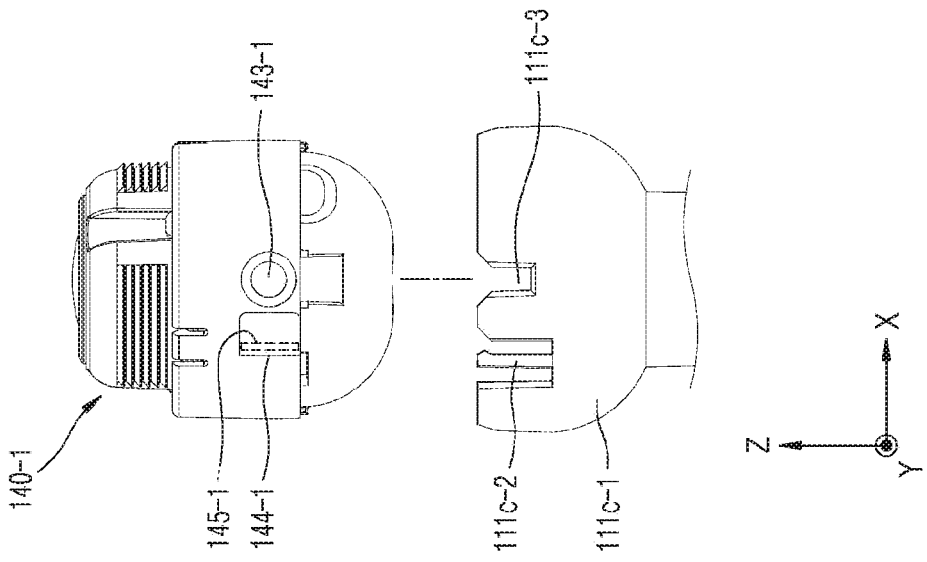

FIG. 12 is a perspective view of the central shaft 111*c* shown in FIG. 2, and FIGS. 13A and 13B are side views of a first lens assembly coupled to the central shaft 111*c* shown in FIG. 12.

Referring to FIGS. 12, 13A, and 13B, the central shaft 111*c* may include a central shaft body 111*c*-1 in which the first lens assembly 140-1 is received and fixed. Also, the central shaft 111*c* may include a snap fit 111*c*-2 rotatably arranged on the central shaft body 111*c*-1. In this case, a separate recess may be formed in opposite sides of the snap fit 111*c*-2 not to disturb movement of the snap fit 111*c*-2 while the snap fit 111*c*-2 moves. A rotational shaft receiving recess 111*c*-3 receiving the first rotational shaft 143-1 may be formed in the central shaft body 111*c*-1. Also, a first cable receiving recess 111*c*-4 for receiving a first cable of the first lens assembly 140-1 may be formed in the central shaft body 111*c*-1.

The first lens assembly 140-1 may be separated from a lens bracket and arranged and received in the central shaft 111*c*.

Specifically, the first lens assembly 140-1 may be separated from the lens bracket and then arranged on the central shaft 111*c* and received in the central shaft 111*c*. In this case, the first rotational shaft 143-1 may be received in the rotational shaft receiving recess 111*c*-3. Also, the first stopper 144-1 may contact the snap fit 111*c*-2. In this case, since the first lens assembly 140-1 is continuously received in the central shaft 111*c*, the first stopper 144-1 may apply force on the snap fit 111*c*-2 and the snap fit 111*c*-2 may rotate. After that, when the first stopper 144-1 passes through a portion of the snap fit 111*c*-2, the snap fit 111*c*-2 may restrict the first stopper 144-1. In this case, since a portion of the snap fit 111*c*-2 may protrude, the first stopper 144-1 may be hooked at the portion of the snap fit 111*c*-2. Particularly, the protruding portion of the snap fit 111*c*-2 may be arranged at an end of the snap fit 111*c*-2 to restrict the first stopper 144-1 and then prevent the first stopper 144-1 from being detached from the snap fit 111*c*-2.

In the case where the first lens assembly 140-1 is coupled to the central shaft 111*c*, the first cable of the first lens assembly 140-1 may be drawn through the first cable receiving recess 111*c*-4. In this case, the first cable may be drawn to a lateral side of the central shaft 111*c* through the first cable receiving recess 111*c*-4.

Therefore, the surveillance camera may position and fix a lens assembly 140 on the rail or on the central shaft 111*c* at the center of the apparatus. Also, the surveillance camera may use the same type of lens assembly 140 for the rail and the central shaft 111*c*.

Figure 14:
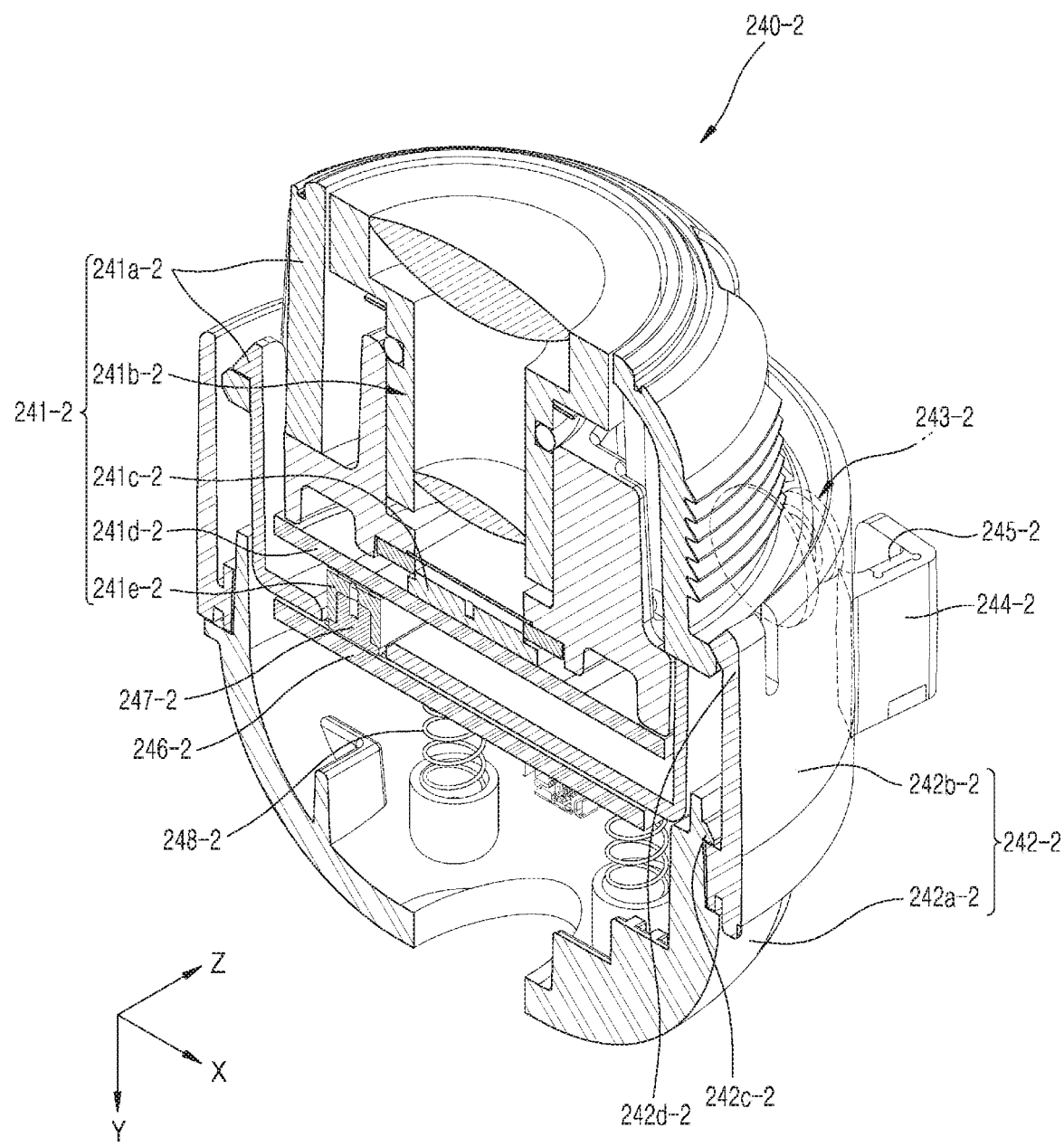
FIG. 14 is a cross-sectional view of a second lens assembly of a surveillance camera according to another exemplary embodiment.

FIG. 14 is a perspective view of a second lens assembly of a surveillance camera according to another exemplary embodiment.

Referring to FIG. 14, the surveillance camera may include a base housing, a fixed housing, a cover housing, a lens bracket, a cover, and a lens assembly. In this case, the lens assembly may include a first lens assembly and a second lens assembly 240-2. In this case, since the base housing, the fixed housing, the cover housing, the lens bracket, the cover, and the first lens assembly are the same as or similar to those described above, detailed descriptions thereof are omitted to avoid redundancy.

The second lens assembly 240-2 may include a second lens module 241-2, a second lens housing 242-2, a second rotational shaft 243-2, a second stopper 244-2, a second rotation prevention portion 245-2, a second housing circuit board 246-2, a second housing connector 247-2, and an elastic unit 248-2. In this case, since the second lens housing 242-2, the second rotational shaft 243-2, the second stopper 244-2, the second rotation prevention portion 245-2, the second housing circuit board 246-2, and the second housing connector 247-2 are the same as or similar to those described above, detailed descriptions thereof are omitted to avoid redundancy.

The second lens module 241-2 may be formed the same as or similar to the first lens module 141-1 described with reference to FIGS. 7 and 8. That is, the second lens module 241-2 may include a second lens case 241a-2, a second lens unit 241b-2, a second sensor 241c-2, a second sensor circuit board 241d-2, and a second substrate connector 241e-2.

The second lens housing 242-2 may include a second bottom housing 242a-2 and a second top housing 242b-2. In this case, the second bottom housing 242a-2 and the second top housing 242b-2 may be formed the same as or similar to the first bottom housing 142a-1 and the first top housing 142b-1 described with reference to FIGS. 7 and 8.

The elastic unit 248-2 may be arranged between the second bottom housing 242a-2 and the second housing circuit board 246-2. In this case, the elastic unit 248-2 may provide elastic force by use of a spring or other resilient member to the second housing circuit board 246-2, and the second housing circuit board 246-2 may receive force directed toward the second top housing 242b-2 through the elastic unit 248-2. The second housing circuit board 246-2 may move to a top surface of the second top housing 242b-2.

Coupling of the second lens assembly 240-2 will now be described. A user may couple the second top housing 242b-2 to the second bottom housing 242a-2, and then insert the second lens module 241-2 into the second lens housing 242-2. In this case, a size of the second lens module 241-2 may be different depending on its resolution. For example, as the resolution increases, the size (or length) of the second lens module 241-2 may increase. A size, a shape, etc. of the second bottom housing 242a-2 and a size, a shape, etc. of the second top housing 242b-2 may be substantially the same regardless of the resolution of the second lens module 241-2. In this case, a portion of the second lens module 241-2 protruding from the top surface of the second top housing 242b-2 may be different depending on the resolution of the second lens module 241-2.

In this case, when the second lens module 241-2 is received in the second top housing 242b-2 and the second bottom housing 242a-2, the second lens module 241-2 may pass through a second coupling hook 242A*d*-2 of the second top housing 242b-2 and enter the inside of the second lens housing 242-2. In this case, the second housing circuit board 246-2 may be arranged adjacent to an open portion of the second lens housing 242-2 by the elastic unit 248-2. Since the second lens module 241-2 is inserted in the second lens housing 242-2, the second housing circuit board 246-2 may perform a linear motion inside the second lens housing 242-2. That is, the second housing circuit board 246-2 may move from the open portion of the second lens housing 242-2 to a bottom surface of the second lens housing 242-2. In this case, the second housing circuit board 246-2 may move while the second housing connector 247-2 contacts the second substrate connector 241e-2.

When the second housing circuit board 246-2 reaches the bottom surface of the second lens housing 242-2, since the second housing circuit board 246-2 may be supported by the second lens housing 242-2, the second substrate connector 241e-2 may be coupled to the second housing connector 247-2. In this case, the elastic unit 248-2 may be compressed.

After that, when force is removed, the elastic unit 248-2 may move the second housing circuit board 246-2 and the second lens module 241-2 from the bottom surface of the second lens housing 242-2 to the open portion of the second lens housing 242-2 by applying elastic force to the second housing circuit board 246-2.

Since the second lens case 241a-2 moving as described above is hooked at the second coupling hook 242d-2, the second lens case 241a-2 may not be drawn to the open portion of the second lens housing 242-2 through the open portion of the second lens housing 242-2.

In the case where the second lens module 241-2 is received in the second lens housing 242-2, the second lens module 241-2 may push a first coupling hook 242c-2 from an inner surface of the second bottom housing 242a-2 to an inner surface of the second top housing 242b-2. In this case, since the first coupling hook 242c-2 is closely attached on a separate protrusion formed on the second top housing 242b-2, the first coupling hook 242c-2 may prevent the second top housing 242b-2 and the second bottom housing 242a-2 from being separated from each other.

This structure is equally applicable to not only the second lens assembly 240-2 but also the first lens assembly described above.

Therefore, the surveillance camera may couple a lens module using lens unit of various resolutions to one lens housing and use the same. Also, the surveillance camera may not require a design change or a separate structure to arrange lens assemblies of different resolutions by using the lens assemblies of different resolutions in the camera.

Figure 15:
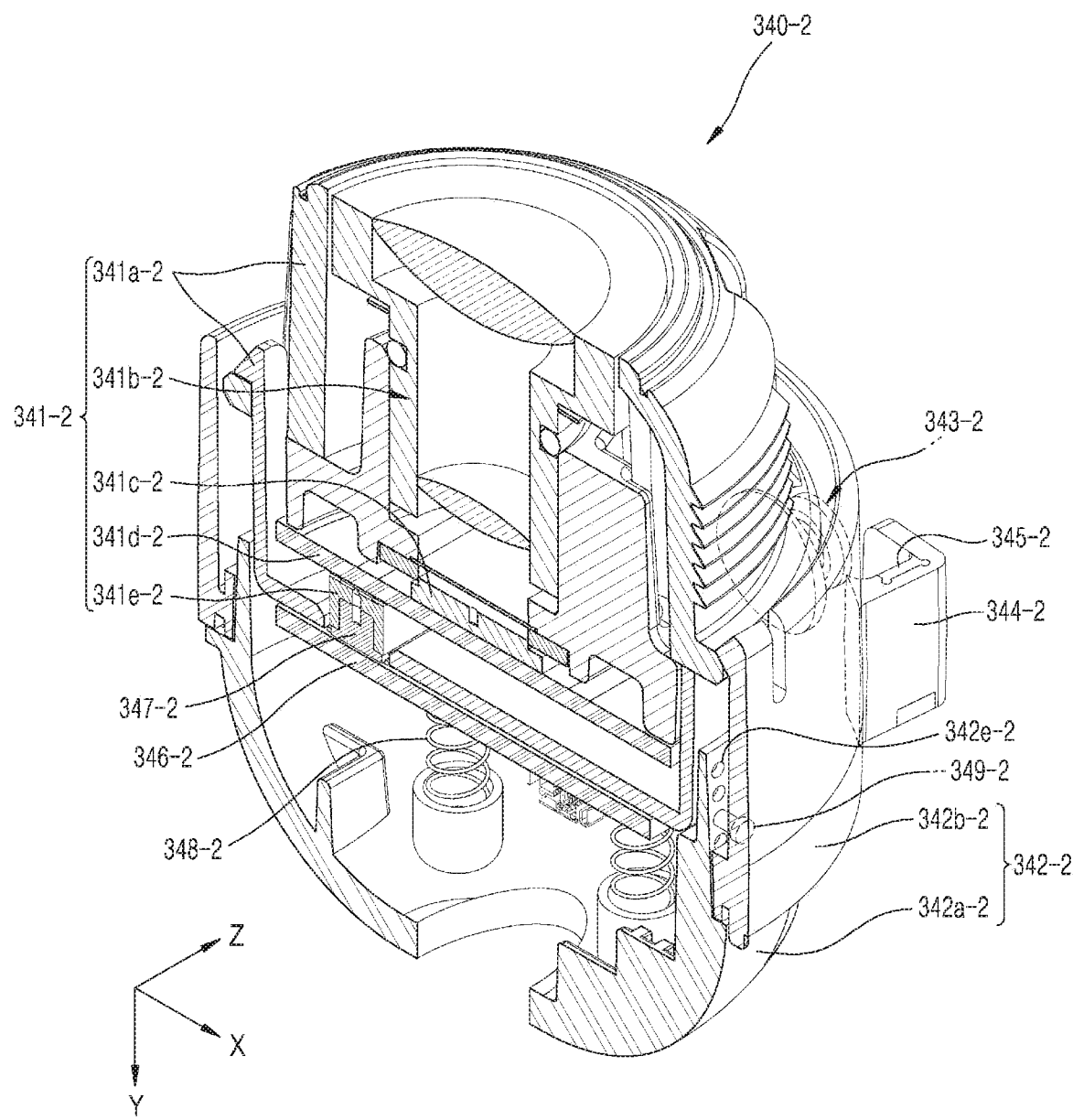
FIG. 15 is a cross-sectional view of a second lens assembly of a surveillance camera according to another exemplary embodiment.

FIG. 15 is a cross-sectional view of a second lens assembly of a surveillance camera according to another exemplary embodiment.

Referring to FIG. 15, the surveillance camera may include a base housing, a fixed housing, a cover housing, a lens bracket, a cover, and a lens assembly. In this case, the lens assembly may include a first lens assembly and a second lens assembly 340-2. In this case, since the base housing, the fixed housing, the cover housing, the lens bracket, the cover, and the first lens assembly are the same as or similar to those described above, detailed descriptions thereof are omitted to avoid redundancy.

The second lens assembly 340-2 may include a second lens module 341-2, a second lens housing 342-2, a second rotational shaft 343-2, a second stopper 344-2, a second rotation prevention portion 345-2, a second housing circuit board 346-2, a second housing connector 347-2, and an elastic unit 348-2. In this case, since the second lens module 341-2, the second lens housing 342-2, the second rotational shaft 343-2, the second stopper 344-2, the second rotation prevention portion 345-2, the second housing circuit board 346-2, the second housing connector 347-2, and the elastic unit 348-2 are the same as or similar to those described above, detailed descriptions thereof are omitted to avoid redundancy.

The second lens housing 342-2 may include a second bottom housing 342a-2 and a second top housing 342b-2. In this case, the second bottom housing 342a-2 and the second top housing 342b-2 may be formed the same as or similar to the first bottom housing 142a-1 and the first top housing 142b-1 described with reference to FIGS. 7 and 8.

A fixing member receiving hole 342e-2 may be formed in the second bottom housing 342a-2, the fixing member receiving hole 342e-2 determining a location of the second lens module 341-2. In this case, since a fixing member 349-2 such as a bolt, a screw, and a pin is received in the fixing member receiving hole 342e-2 and contacts the second lens module 341-2, the fixing member 349-2 may fix a location of the second lens module 341-2. In this case, the fixing member receiving hole 342e-2 may be formed in various shapes. In an exemplary embodiment, a plurality of fixing member receiving holes 342e-2 may be provided such that the fixing member receiving holes 342e-2 are spaced apart from each other in a lengthwise direction of the second bottom housing 342a-2. In another exemplary embodiment, the fixing member receiving hole 342e-2 may be formed as a long hole. In this case, the fixing member receiving hole 342e-2 may be formed long in a direction (e.g., the lengthwise direction of the second bottom housing 342a-2) in which the second lens module 341-2 is received in the second bottom housing 342a-2. In this case, a hole receiving the fixing member 349-2 may be separately formed in the second lens module 341-2. In this case, the fixing member 349-2 may pass through the fixing member receiving hole 342e-2 and is received in the hole of the second lens module 341-2 to fix the second lens module 341-2.

A method of assembling the second lens assembly 340-2 may be similar to the method described above. The second lens module 341-2 may be received inside the second bottom housing 342a-2, and then fixed by the second top housing 342b-2. In this case, to adjust a focal length of the second lens module 341-2, a location of the second lens module 341-2 is varied and then the fixing member 349-2 may be fixed in the fixing member receiving hole 342e-2. In this case, an opening may be formed in a lateral surface of the second top housing 342b-2 such that the fixing member 349-2 is received and the fixing member receiving hole 342e-2 is exposed to the outside. In another exemplary embodiment, a location of the second lens module 341-2 may be fixed by inserting the fixing member 349-2, and then the second top housing 342b-2 may be coupled to the second bottom housing 342a-2 to shield the fixing member 349-2.

This structure is equally applicable to not only the second lens assembly 340-2 but also the first lens assembly described above.

Therefore, the surveillance camera may couple a lens module using lens unit of various resolutions to one lens housing and use the same. Also, the surveillance camera may not require a design change or a separate structure to arrange lens assemblies of different resolutions by using the lens assemblies of different resolutions in the camera. Also, the surveillance camera may precisely adjust a focal length of a lens.

Figure 16:
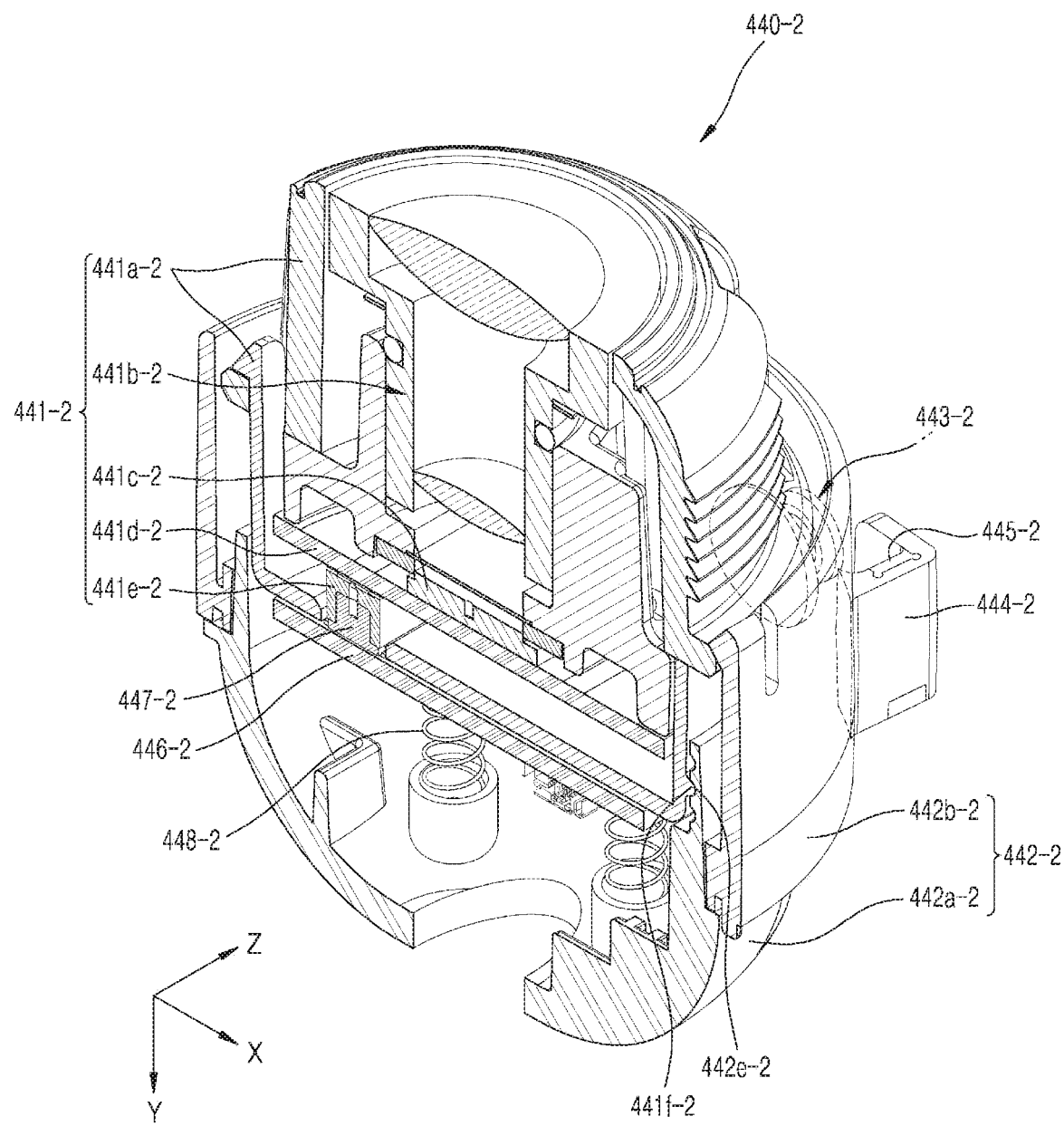
FIG. 16 is a cross-sectional view of a second lens assembly of a surveillance camera according to another exemplary embodiment.

FIG. 16 is a cross-sectional view of a second lens assembly of a surveillance camera according to another exemplary embodiment.

Referring to FIG. 16, the surveillance camera may include a base housing, a fixed housing, a cover housing, a lens bracket, a cover, and a lens assembly. In this case, the lens assembly may include a first lens assembly and a second lens assembly 440-2. In this case, since the base housing, the fixed housing, the cover housing, the lens bracket, the cover, and the first lens assembly are the same as or similar to those described above, detailed descriptions thereof are omitted to avoid redundancy.

The second lens assembly 440-2 may include a second lens module 441-2, a second lens housing 442-2, a second rotational shaft 443-2, a second stopper 444-2, a second rotation prevention portion 445-2, a second housing circuit board 446-2, a second housing connector 447-2, and an elastic unit 448-2. In this case, since the second lens module 441-2, the second lens housing 442-2, the second rotational shaft 443-2, the second stopper 444-2, the second rotation prevention portion 445-2, the second housing circuit board 446-2, the second housing connector 447-2, and the elastic unit 448-2 are the same as or similar to those described above, detailed descriptions thereof are omitted to avoid redundancy.

The second lens module 441-2 may be formed the same as or similar to the first lens module 141-1 described with reference to FIGS. 7 and 8. That is, the second lens module 441-2 may include a second lens case 441a-2, a second lens unit 441b-2, a second sensor 441c-2, a second sensor circuit board 441d-2, and a second substrate connector 441e-2.

One of the second bottom housing 442a-2 and the second lens module 441-2 may include a focus determining protrusion 441f-2, and the other of the second bottom housing 442a-2 and the second lens module 441-2 may include a receiving portion 442e-2. Hereinafter, for convenience of description, a case where the second bottom housing 442a-2 includes the receiving portion 442e-2 and the second lens module 441-2 includes the focus determining protrusion 441f-2 is mainly described in detail.

The focus determining protrusion 441f-2 may protrude from an outer surface of the second lens module 441-2 to an inner surface of the second bottom housing 442a-2. The receiving portion 442e-2 may be arranged in the inner surface of the second bottom housing 442a-2. In this case, the receiving portion 442e-2 may be formed as a recess such that the receiving portion 442e-2 is recessed from the inner surface of the second bottom housing 442a-2, or may be formed as a hole. Also, the receiving portion 442e-2 may be provided as a plurality of receiving portions. The plurality of receiving portions 442e-2 may be spaced apart from each other. That is, the plurality of receiving portions 442e-2 may be spaced apart from each other over an open portion of the second bottom housing 442a-2 to a bottom surface of the second bottom housing 442a-2.

A method of assembling the second lens assembly 440-2 may be similar to the method described above. In this case, in the case where the second lens module 441-2 is arranged in the second bottom housing 442a-2 and then received in the second bottom housing 442a-2, the second lens module 441-2 may be fixed at different locations of the second bottom housing 442a-2. For example, in the case where a user applies force to insert the second lens module 441-2 into the second bottom housing 442a-2, the focus determining protrusion 441f-2 may be coupled to one of the plurality of receiving portions 442e-2. In this case, the user may vary a location of the second lens module 441-2 such that the focus determining protrusion 441f-2 is received in one of the plurality of receiving portions 442e-2 depending on a focus of the second lens module 441-2, and then fix the second lens module 441-2.

This structure is equally applicable to not only the second lens assembly 440-2 but also the first lens assembly described above.

Therefore, the surveillance camera may couple a lens module using lens unit of various resolutions to one lens housing and use the same. Also, the surveillance camera may not require a design change or a separate structure to arrange lens assemblies of different resolutions by using the lens assemblies of different resolutions in the camera. Also, the surveillance camera may precisely adjust a focal length of a lens.

Some of the advantages that may be achieved by exemplary embodiments of the invention include: the ability to manufacture lens assemblies in the same size even where lenses of different resolutions are used.

A lens assembly according to exemplary embodiments may be installed in the same lens bracket.

In a surveillance camera according to exemplary embodiments, a lens bracket may be replaced quickly and easily.

Also, in a surveillance camera according to exemplary embodiments, at least one of a plurality of lens brackets may be separated from a rail, and then the rest of the plurality of lens brackets may be arranged at a desired location on the rail.

Since a surveillance camera according to exemplary embodiments may vary a location of a lens bracket and then solidly fix the location of the lens bracket, a user may obtain an image of a desired location.

Moreover a top surface and a bottom surface of the lens housings as described above may be arranged in the same direction in each member.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A lens assembly comprising:
a lens sub-assembly comprising a lens;
a lens case in which the lens sub-assembly is received;
a sensor circuit board comprising a sensor connected with the lens sub-assembly, the sensor circuit board being disposed in the lens assembly; and
a flexible circuit board disposed inside the lens assembly and facing the lens sub-assembly, the flexible circuit board being connected to the sensor circuit board and being bent at least once such that a first portion of the flexible circuit board overlaps a second portion of the flexible circuit board,
wherein the lens, the sensor, the first portion, and the second portion overlap one another along an optical axis of the lens.

2. The lens assembly of claim 1, further comprising:
a substrate connector arranged on the sensor circuit board.

3. The lens assembly of claim 2, wherein the substrate connector and an external contact connector of the flexible circuit board are stacked on each other.

4. The lens assembly of claim 1, further comprising:
a bottom housing arranged outside the lens case and configured to receive a portion of the lens case therein; and
a top housing coupled to the bottom housing.

5. The lens assembly of claim 4, further comprising:
a substrate connector arranged on the sensor circuit board, wherein the bottom housing comprises a housing connector electrically connected to the substrate connector via the flexible circuit board.

6. The lens assembly of claim 5, further comprising:
a housing circuit board arranged inside the bottom housing,
wherein the housing connector is electrically connected between the flexible circuit board and the housing circuit board.

7. The lens assembly of claim 6, further comprising:
an elastic supporter arranged between the bottom housing and the housing circuit board, the elastic support being configured to provide elastic force to the housing circuit board.

8. The lens assembly of claim 4, further comprising:
a fixing member receiving hole formed in the bottom housing, the fixing member receiving hole being configured to receive a fixing member configured to fix a location of the lens case.

9. The lens assembly of claim 4, wherein:
one of the bottom housing and the lens case comprises a focus determining protrusion protruding from the one of the bottom housing and the lens case toward the other of the bottom housing and the lens case; and
the other of the bottom housing and the lens case comprises a receiving portion in which the focus determining protrusion is received.

10. A surveillance camera comprising:
one or more lens brackets;
a central shaft spaced apart from the one or more lens brackets;
a first lens assembly having a first size and a first resolution, the first lens assembly being coupled to one among the one or more lens brackets or the central shaft; and
a second lens assembly having a second size and a second resolution, the second lens assembly being coupled to the other among the one or more lens brackets, wherein:
at least one of the first lens assembly and the second lens assembly comprises:
a lens sub-assembly comprising a lens;
a lens case in which the lens sub-assembly is received;
a sensor circuit board supported in the at least one of the first lens assembly and the second lens assembly;
a sensor disposed on the sensor circuit board and connected with the lens sub-assembly; and
a flexible circuit board disposed inside the at least one of the first lens assembly and the second lens assembly and facing the lens sub-assembly, the flexible circuit board being connected to the sensor circuit board and being bent at least once such that the bent flexible circuit board is configured to support the sensor circuit board with elastic force thereof, and
wherein the lens, the sensor, the first portion, and the second portion overlap one another along an optical axis of the lens.

11. The surveillance camera of claim 10, further comprising:
a support member, the one or more lens brackets being movably supported by and detachably coupled to the support member, wherein:
the first resolution is different from the second resolution, and
wherein the first size is substantially same as the second size.

12. The surveillance camera of claim 10, wherein the at least one of the first lens assembly and the second lens assembly further comprises a substrate connector arranged on the sensor circuit board.

13. The surveillance camera of claim 12, wherein the substrate connector and an external contact connector of the flexible circuit board are stacked on each other.

14. The surveillance camera of claim 10, wherein the at least one of the first lens assembly and the second lens assembly further comprises:
   a bottom housing arranged outside the lens case and configured to receive a portion of the lens case therein; and
   a top housing coupled to the bottom housing.

15. The surveillance camera of claim 14, wherein:
   the at least one of the first lens assembly and the second lens assembly further comprises a substrate connector arranged on the sensor circuit board; and
   the bottom housing comprises a housing connector electrically connected to the substrate connector via the flexible circuit board.

16. The surveillance camera of claim 15, wherein:
   the at least one of the first lens assembly and the second lens assembly further comprises a housing circuit board arranged inside the bottom housing; and
   the housing connector is electrically connected between the flexible circuit board and the housing circuit board.

17. The surveillance camera of claim 16, wherein the at least one of the first lens assembly and the second lens assembly further comprises an elastic supporter arranged between the bottom housing and the housing circuit board, the elastic supporter being configured to provide elastic force to the housing circuit board.

18. The surveillance camera of claim 14, wherein the at least one of the first lens assembly and the second lens assembly further comprises a fixing member receiving hole formed in the bottom housing, the fixing member receiving hole being configured to receive-a fixing member configured to fix a location of the lens case.

19. The surveillance camera of claim 14, wherein:
   one of the bottom housing and the lens case comprises a focus determining protrusion protruding from the one of the bottom housing and the lens case toward the other of the bottom housing and the lens case; and
   the other of the bottom housing and the lens case comprises a receiving portion in which the focus determining protrusion is received.

* * * * *